(12) United States Patent
Katsuno et al.

(10) Patent No.: US 9,299,901 B2
(45) Date of Patent: Mar. 29, 2016

(54) SEMICONDUCTOR LIGHT EMITTING DEVICE

(71) Applicant: Kabushiki Kaisha Toshiba, Minato-ku (JP)

(72) Inventors: Hiroshi Katsuno, Tokyo (JP); Satoshi Mitsugi, Kanagawa-ken (JP); Toshihide Ito, Tokyo (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/173,966

(22) Filed: Feb. 6, 2014

(65) Prior Publication Data

US 2014/0225142 A1     Aug. 14, 2014

(30) Foreign Application Priority Data

Feb. 12, 2013     (JP) .................... 2013-024999

(51) Int. Cl.
*H01L 33/38* (2010.01)
*H01L 33/62* (2010.01)

(52) U.S. Cl.
CPC ............. *H01L 33/62* (2013.01); *H01L 33/38* (2013.01); *H01L 2924/0002* (2013.01)

(58) Field of Classification Search
CPC ....... H01L 33/20; H01L 33/38; H01L 33/382; H01L 33/385; H01L 33/387
See application file for complete search history.

(56) References Cited

U.S. PATENT DOCUMENTS

| 2011/0101390 A1* | 5/2011 | Engl et al. ............ 257/93 |
| 2011/0210362 A1* | 9/2011 | Lee et al. ............ 257/98 |
| 2012/0018764 A1* | 1/2012 | Choi et al. ............ 257/99 |
| 2012/0235168 A1* | 9/2012 | Katsuno et al. ......... 257/88 |
| 2013/0234182 A1 | 9/2013 | Katsuno et al. |

FOREIGN PATENT DOCUMENTS

JP     2005-322847     11/2005

* cited by examiner

*Primary Examiner* — Yu Chen
(74) *Attorney, Agent, or Firm* — Oblon, McClelland, Maier & Neustadt, L.L.P.

(57) ABSTRACT

According to one embodiment, a semiconductor light emitting device includes a metal layer, a stacked structural body, a first electrode, a pad electrode, a first conductive layer, a second conductive layer and an insulating layer. The metal layer includes a major surface having a first region, a second region, a third region and a fourth region. The stacked structural body includes a first semiconductor layer, a second semiconductor layer and a light emitting layer. The first semiconductor layer includes a first portion and a second portion. The second semiconductor layer is provided between the first region and the first portion. The first electrode is provided between the second region and the second portion. The pad electrode is provided on the third region. The first conductive layer is provided between the second region and the first electrode and between the third region and the pad electrode.

16 Claims, 6 Drawing Sheets

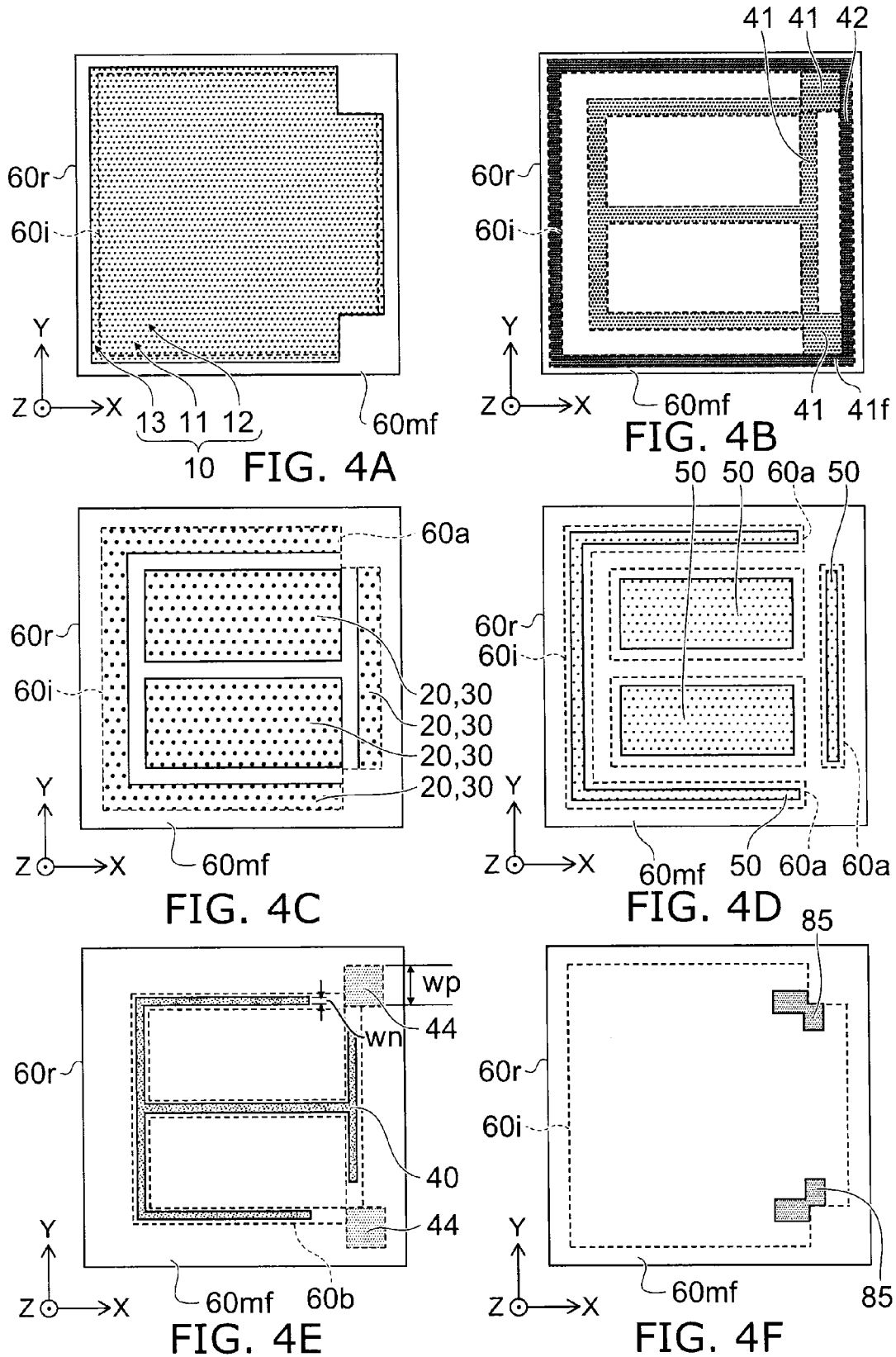

SEMICONDUCTOR LIGHT EMITTING DEVICE

CROSS-REFERENCE TO RELATED APPLICATIONS

This application is based upon and claims the benefit of priority from Japanese Patent Application No. 2013-024999, filed on Feb. 12, 2013; the entire contents of which are incorporated herein by reference.

FIELD

Embodiments described herein relate generally to a semiconductor light emitting device.

BACKGROUND

In one structure of a semiconductor light emitting device such as an LED (Light Emitting Diode), etc., a crystal layer that is formed on a substrate of, for example, sapphire, etc., is bonded to a conductive substrate; and the substrate is subsequently removed. It is desirable to increase the electrostatic discharge (ESD) immunity of the semiconductor light emitting device.

BRIEF DESCRIPTION OF THE DRAWINGS

FIG. 4A to FIG. 4F are schematic plan views showing the semiconductor light emitting device according to the first embodiment;

DETAILED DESCRIPTION

Figure 1A:
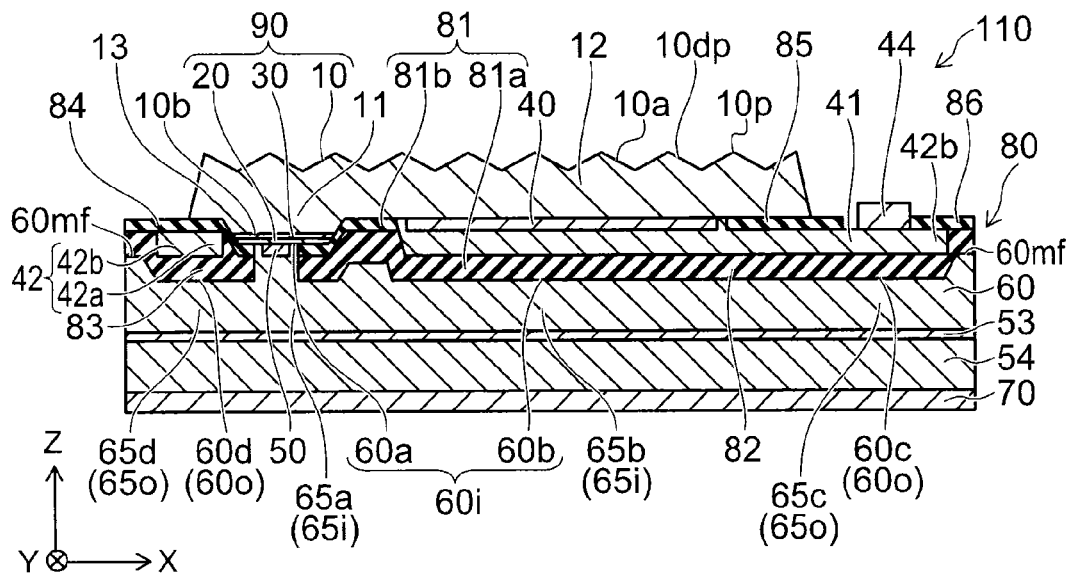
FIG. 1A and FIG. 1B are schematic views showing a semiconductor light emitting device according to a first embodiment.

In general, according to one embodiment, a semiconductor light emitting device includes a metal layer, a stacked structural body, a first electrode, a pad electrode, a first conductive layer, a second conductive layer and an insulating layer. The metal layer includes a major surface having an inner region and an outer region. The inner region has a first region and a second region. The outer region is provided outside the inner region. The outer region has a third region and a fourth region. The stacked structural body provided on the major surface of the metal layer. The stacked structural body includes a first semiconductor layer of a first conductivity type, a second semiconductor layer of a second conductivity type and a light emitting layer. The first semiconductor layer includes a first portion provided on the first region and a second portion provided on the second region. The second semiconductor layer is provided between the first region and the first portion. The light emitting layer is provided between the first portion and the second semiconductor layer. The first electrode is provided between the second region and the second portion to be electrically connected to the second portion. The pad electrode is provided on the third region. The first conductive layer is provided between the second region and the first electrode and between the third region and the pad electrode. The first conductive layer is configured to electrically connect the first electrode to the pad electrode. The second conductive layer is provided on the fourth region to be electrically connected to the first conductive layer. The second electrode is provided between the first region and the second semiconductor layer to be electrically connected to the second semiconductor layer. The insulating layer includes a first insulating portion, a second insulating portion and a third insulating portion. The first insulating portion is provided between the second region and the first conductive layer. The second insulating portion is provided between the third region and the first conductive layer. The third insulating portion is provided between the fourth region and the second conductive layer.

Embodiments will now be described with reference to the drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
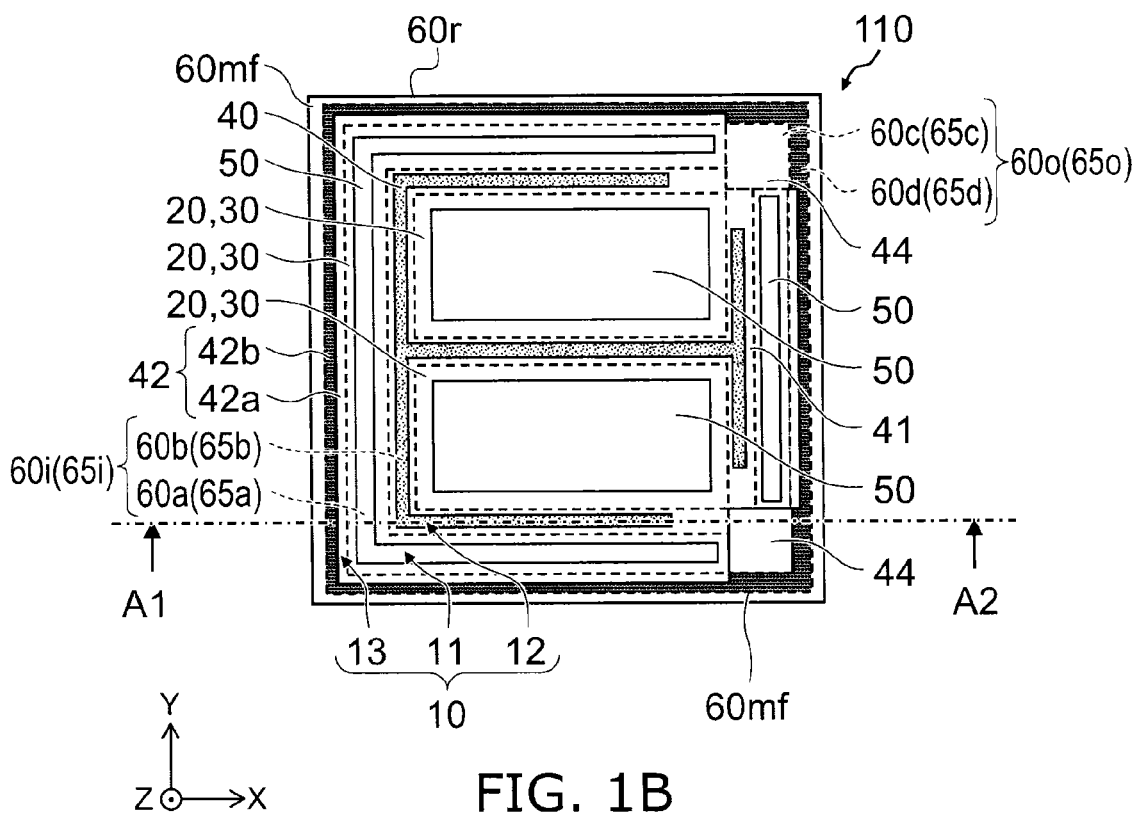

FIG. 1A and FIG. 1B are schematic views showing a semiconductor light emitting device according to a first embodiment.

FIG. 1B is a schematic plan view. FIG. 1A is an enlarged cross-sectional view along line A1-A2 of FIG. 1B. FIG. 1B is a perspective view; and the insulating layers are not shown in FIG. 1B.

In the semiconductor light emitting device 110 according to the embodiment as shown in FIG. 1A and FIG. 1B, for example, a support substrate 54 is provided on a back surface electrode 70; a bonding layer 53 is provided on the support substrate 54; and a metal layer 60 is provided on the bonding layer 53. The bonding layer 53 and the support substrate 54 are conductive. The metal layer 60 is electrically connected to the back surface electrode 70.

A stacked structural body 90, a first electrode 40, a pad electrode 44, a first conductive layer 41, a second conductive layer 42, a second electrode 50, and an insulating layer 80 are provided on the metal layer 60.

In the specification, the state of being "provided on" includes not only the state of being provided in direct contact but also the state in which another component is inserted therebetween.

The stacked structural body 90 is provided on the metal layer 60. A portion of the insulating layer 80 is disposed between the stacked structural body 90 and a portion of the metal layer 60. In other words, a portion of the insulating layer 80 is provided on a portion of the metal layer 60. The insulating layer 80 includes, for example, first to sixth insulating portions 81 to 86, etc. A portion of the stacked structural body 90 is disposed on portions of the insulating layer 80 (the first insulating portion 81 and the second insulating portion 82).

The stacked structural body 90 includes a first semiconductor layer 10, a second semiconductor layer 20, and a light emitting layer 30. The first semiconductor layer 10 has a first conductivity type; and the second semiconductor layer 20 has a second conductivity type. For example, the first conductivity type is an n type; and the second conductivity type is a p type. The first conductivity type may be the p type; and the second conductivity type may be the n type. In the following example, the first conductivity type is the n type; and the second conductivity type is the p type.

The second electrode 50 is provided on a portion of the metal layer 60 where the insulating layer 80 is not provided. The second semiconductor layer 20 is provided on the second electrode 50. The light emitting layer 30 is provided on the second semiconductor layer 20.

A direction from the second semiconductor layer 20 toward the first semiconductor layer 10 is taken as a stacking direction (a Z-axis direction). One direction orthogonal to the Z-axis direction is taken as an X-axis direction. A direction orthogonal to the Z-axis direction and the X-axis direction is taken as a Y-axis direction.

For example, the first semiconductor layer 10 includes first to third portions 11 to 13. The first portion 11 is disposed on the light emitting layer 30. In other words, the light emitting layer 30 is disposed between the first portion 11 and the second semiconductor layer 20. The second portion 12 is arranged with the first portion 11 along a direction perpendicular to the Z-axis direction. The third portion 13 is arranged with the first portion 11 along a direction perpendicular to the Z-axis direction.

The first conductive layer 41 is provided on portions of the insulating layer 80 (the first insulating portion 81 and the second insulating portion 82). The first electrode 40 is provided on a portion of the first conductive layer 41. The pad electrode 44 is provided on another portion of the first conductive layer 41.

The second portion 12 of the first semiconductor layer 10 is provided on the first electrode 40. The second portion 12 is electrically connected to the pad electrode 44 via the first electrode 40 and the first conductive layer 41. A portion of the insulating layer 80 (a portion of the first insulating portion 81) is disposed between the first conductive layer 41 and the side surface of the second semiconductor layer 20 and between the first conductive layer 41 and the side surface of the light emitting layer 30. In the example, the first insulating portion 81 includes a first film portion 81a and a second film portion 81b. The first film portion 81a is continuous from the second insulating portion 82. The second film portion 81b is provided on the first film portion 81a. The boundary between the first film portion 81a and the second film portion 81b may be observed in some cases and may not be observed in some cases.

In the example, a fifth insulating portion 85 is disposed between yet another portion of the first conductive layer 41 and a portion of the first semiconductor layer 10 (a portion of the second portion 12).

The first semiconductor layer 10 has a first major surface 10a (e.g., the upper surface) and a second major surface 10b (e.g., the lower surface). The second major surface 10b opposes the light emitting layer 30. The first major surface 10a is a major surface that is opposite to the second major surface 10b. In the example, the first major surface 10a has an unevenness 10dp. The unevenness 10dp includes multiple protrusions 10p.

The first semiconductor layer 10 is electrically connected to the pad electrode 44 via the first electrode 40 and the first conductive layer 41. The second semiconductor layer 20 is electrically connected to the back surface electrode 70 via the second electrode 50, the metal layer 60, the bonding layer 53, and the support substrate 54. The first semiconductor layer 10 is insulated from the metal layer 60, the bonding layer 53, the support substrate 54, and the back surface electrode 70 by the insulating layer 80. The second semiconductor layer 20 is insulated from the first conductive layer 41, the first electrode 40, and the pad electrode 44 by the insulating layer 80.

A current is supplied to the light emitting layer 30 via the support substrate 54, the bonding layer 53, the metal layer 60, the second electrode 50, the second semiconductor layer 20, the first conductive layer 41, the first electrode 40, and the first semiconductor layer 10 by applying a voltage between the back surface electrode 70 and the pad electrode 44. For example, carriers (e.g., electrons) are injected into the first semiconductor layer 10 from the first electrode 40. For example, carriers (e.g., holes) are injected into the second semiconductor layer 20 from the second electrode 50. Thereby, light is emitted from the light emitting layer 30. The light is emitted outside the device mainly from the upper surface (the first major surface 10a) of the first semiconductor layer 10. The first major surface 10a is used as a light emitting surface. The semiconductor light emitting device 110 is, for example, a light emitting diode (LED).

Thus, the stacked structural body 90 is provided on a portion of the metal layer 60. The stacked structural body 90 is provided at an inner portion of the semiconductor light emitting device 110.

On the other hand, the second conductive layer 42 is provided at a peripheral portion of the semiconductor light emitting device 110. For example, at least a portion of the second conductive layer 42 is provided at a portion outside the stacked structural body 90. A portion of the insulating layer 80 (a third insulating portion 83) is disposed between the second conductive layer 42 and the metal layer 60. In the example, the third portion 13 of the first semiconductor layer 10 is disposed on a portion of the second conductive layer 42. A portion of the insulating layer 80 (a portion of a fourth insulating portion 84) is disposed between the second conductive layer 42 and the first semiconductor layer 10, between the second conductive layer 42 and the light emitting layer 30, and between the second conductive layer 42 and the second semiconductor layer 20. The boundary between the third insulating portion 83 and the fourth insulating portion 84 may be observed in some cases and may not be observed in some cases.

An example of the planar pattern of the conductive portions of the semiconductor light emitting device 110 will now be described with reference to FIG. 2, FIG. 3A to FIG. 3F, and FIG. 4A to FIG. 4F. An overview of the planar pattern of the conductive portions will now be described briefly using FIG. 1B.

As shown in FIG. 1B, the configuration of a major surface 60mf of the metal layer 60 is, for example, a rectangle. In the example, the second conductive layer 42 is provided along an outer edge 60r (described below) of the major surface 60mf. The second conductive layer 42 has a rectangular annular configuration. In the example, the pad electrode 44 is provided at two corners of one side of the second conductive layer 42. The first conductive layer 41 is provided inside the annular configuration of the second conductive layer 42. In the example, the first conductive layer 41 includes a portion provided along the four sides of the rectangle and a portion provided at the central portion of the rectangle to extend along the X-axis direction. The first electrode 40 overlaps a portion of the first conductive layer 41 when projected onto the X-Y plane. The first semiconductor layer 10, the second semiconductor layer 20, and the light emitting layer 30 are provided on a portion of the major surface 60mf of the metal layer 60 (a portion where the pad electrode 44 is not provided). The configurations of the components are described below.

The second conductive layer 42 is set to have, for example, a ground potential. The second conductive layer 42 is used as a grounding portion. A field plate effect is obtained by providing the grounding portion which is the second conductive layer 42 around the stacked structural body 90. Thereby, electric field concentration is suppressed; and the electric field distribution inside the device can be stabilized. As a result, the electrostatic discharge (ESD) immunity can be increased.

An example of the configuration of the semiconductor light emitting device 110 will now be described further.

As shown in FIG. 1A and FIG. 1B, the stacked structural body 90 is provided on a portion of the upper surface (the major surface 60mf) of the metal layer 60.

The major surface 60mf of the metal layer 60 is substantially perpendicular to the Z-axis direction. The major surface 60mf is substantially parallel to the X-Y plane (the plane perpendicular to the stacking direction from the first semiconductor layer 10 toward the second semiconductor layer 20). However, as shown in FIG. 1A, the major surface 60mf of the metal layer 60 may have an unevenness conforming to, for example, the configuration of a layer provided on the metal layer 60, etc.

The major surface 60mf of the metal layer 60 includes an inner region 60i and an outer region 60o. The outer region 60o is provided outside the inner region 60i. The inner region 60i includes a first region 60a and a second region 60b. The outer region 60o includes a third region 60c and a fourth region 60d.

The first portion 11 of the first semiconductor layer 10 is provided on the first region 60a. The second portion 12 is provided on the second region 60b. The third portion 13 is provided on the fourth region 60d.

The first conductive layer 41 is provided on the second region 60b and on the third region 60c. The first electrode 40 is provided on the second region 60b (on the first conductive layer 41). The pad electrode 44 is provided on the third region 60c (on the first conductive layer 41). The pad electrode 44 does not overlap the first semiconductor layer 10 when projected onto the X-Y plane. The second electrode 50 is provided on the first region 60a. The second semiconductor layer 20 and the light emitting layer 30 are provided on the first region 60a.

For example, the first conductive layer 41 functions as a supplemental interconnect of the first electrode 40. For example, the thickness of the first conductive layer 41 is thicker than the thickness of the first electrode 40. For example, the resistivity of the first conductive layer 41 is lower than the resistivity of the first electrode 40.

The second conductive layer 42 is provided on the fourth region 60d. In the example, a portion (the third portion 13) of the first semiconductor layer 10 is disposed on a portion of the second conductive layer 42. For example, the second conductive layer 42 includes a superimposed portion 42a and a non-superimposed portion 42b. The superimposed portion 42a overlaps the third portion 13 when projected onto the X-Y plane. The non-superimposed portion 42b does not overlap the third portion 13 when projected onto the X-Y plane.

The superimposed portion 42a is disposed between the non-superimposed portion 42b and the first region 60a when projected onto the X-Y plane. The superimposed portion 42a is disposed between the non-superimposed portion 42b and the light emitting layer 30 when projected onto the X-Y plane.

The second conductive layer 42 is electrically connected to, for example, the first conductive layer 41. For example, the second conductive layer 42 is electrically connected to the first conductive layer 41 at the vicinity of the pad electrode 44. For example, at least a portion of the second conductive layer 42 is in the same layer as at least a portion of the first conductive layer 41. For example, the Z-axis direction position of at least a portion of the second conductive layer 42 is the same as the Z-axis direction position of at least a portion of the first conductive layer 41. The material of at least a portion of the second conductive layer 42 is the same as the material of at least a portion of the first conductive layer 41.

The first insulating portion 81 of the insulating layer 80 is provided at least on the second region 60b of the major surface 60mf of the metal layer 60. For example, the first insulating portion 81 is provided between the first conductive layer 41 and a portion of the metal layer 60. The first insulating portion 81 electrically insulates the metal layer 60 from the first conductive layer 41 in the second region 60b of the major surface 60mf.

The second insulating portion 82 of the insulating layer 80 is provided at least on the third region 60c of the major surface 60mf of the metal layer 60. The second insulating portion 82 is provided between the pad electrode 44 (the first conductive layer 41) and a portion of the metal layer 60. The second insulating portion 82 electrically insulates the metal layer 60 from the pad electrode (the first conductive layer 41) in the third region 60c of the major surface 60mf.

The third insulating portion 83 of the insulating layer 80 is provided at least on the fourth region 60d of the major surface 60mf of the metal layer 60. The third insulating portion 83 is provided between the metal layer 60 and the second conductive layer 42. The third insulating portion 83 electrically insulates the metal layer 60 from the second conductive layer 42 in the fourth region 60d of the major surface 60mf.

The fourth insulating portion 84 of the insulating layer 80 is provided between the superimposed portion 42a and the third portion 13 of the first semiconductor layer 10. The fourth insulating portion 84 is provided at least between the superimposed portion 42a of the second conductive layer 42 and the third portion 13 of the first semiconductor layer 10 when projected onto the X-Y plane. For example, the fourth insulating portion 84 contacts the second conductive layer 42 and the first semiconductor layer 10 (the third portion 13). The fourth insulating portion 84 electrically insulates the second conductive layer 42 from the first semiconductor layer 10 at the third portion 13. The fourth insulating portion 84 also is provided on the non-superimposed portion 42b and on the third insulating portion 83.

The fifth insulating portion 85 of the insulating layer 80 is provided, for example, at least between the first electrode 40 and the pad electrode 44 when projected onto the X-Y plane. An example of the fifth insulating portion 85 is described below.

In the example, the insulating layer 80 further includes the sixth insulating portion 86. The sixth insulating portion 86 is provided, for example, between the pad electrode 44 and the outer edge 60r (described below) of the metal layer 60 when projected onto the X-Y plane.

In the example, at least a portion of the first insulating portion 81 contacts the metal layer 60 and contacts the first conductive layer 41. At least a portion of the second insulating portion 82 contacts the metal layer 60 and contacts the first conductive layer 41. At least a portion of the third insulating portion contacts the metal layer 60 and contacts the second conductive layer 42. Thereby, the heat dissipation can be improved.

At least a portion of the fourth insulating portion 84 contacts the second conductive layer 42 and contacts at least a portion of the stacked structural body 90 (the first semiconductor layer 10, the second semiconductor layer 20, and the light emitting layer 30). The fifth insulating portion 85 contacts the first conductive layer 41 and contacts at least a portion of the stacked structural body 90 (the first semiconductor layer 10). Thereby, the heat dissipation can be improved.

Figure 2:
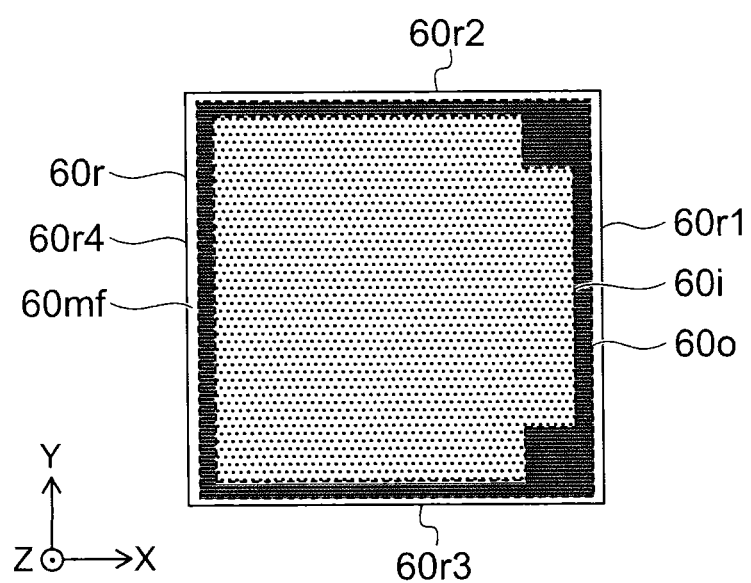
FIG. 2 is a schematic plan view showing the semiconductor light emitting device according to the first embodiment.

FIG. 2 is a schematic plan view showing the semiconductor light emitting device according to the first embodiment.

FIG. 2 shows the major surface 60*mf* of the metal layer 60.

As shown in FIG. 2, the major surface 60*mf* is, for example, a rectangle. The configuration of the major surface 60*mf* is arbitrary. The major surface 60*mf* may be, for example, a hexagon. An example in which the major surface 60*mf* is a rectangle will now be described.

The length of the metal layer 60 (the major surface 60*mf*) in the X-axis direction is, for example, not less than 0.1 mm and not more than 5 mm. The length of the metal layer 60 (the major surface 60*mf*) in the Y-axis direction is, for example, not less than 0.1 mm and not more than 5 mm. The length in the X-axis direction may be different from the length in the Y-axis direction. The lengths are arbitrary in the embodiment.

The major surface 60*mf* includes the outer edge 60*r*. The outer edge 60*r* includes, for example, first to fourth sides 60*r*1 to 60*r*4. The second side 60*r*2 is non-parallel to the first side 60*r*1 and intersects the first side 60*r*1. The third side 60*r*3 is non-parallel to the first side 60*r*1, intersects the first side 60*r*1, and is separated from the second side 60*r*2. The fourth side 60*r*4 is separated from the first side 60*r*1 and intersects the second side 60*r*2 and the third side 60*r*3.

The major surface 60*mf* of the metal layer 60 includes the inner region 60*i* and the outer region 60*o*. The outer region 60*o* is provided outside the inner region 60*i*. At least a portion of the outer region 60*o* is provided along the outer edge 60*r*. The outer region 60*o* is provided, for example, in an annular configuration along the outer edge 60*r*. At least a portion of the outer region 60*o* may contact the outer edge 60*r*. In the example, the outer region 60*o* is separated from the outer edge 60*r*.

The distance (the shortest distance) between the outer region 60*o* and the outer edge 60*r* is shorter than the distance (the shortest distance) between the inner region 60*i* and the outer edge 60*r*. In the case where the outer region 60*o* contacts the outer edge 60*r*, the distance (the shortest distance) between the outer region 60*o* and the outer edge 60*r* is zero.

FIG. 3A to FIG. 3F are schematic plan views showing the semiconductor light emitting device according to the first embodiment.

FIG. 3A to FIG. 3F show examples of patterns of the inner region 60*i*, the outer region 60*o*, the first region 60*a*, the second region 60*b*, the third region 60*c*, and the fourth region 60*d* of the major surface 60*mf* of the metal layer 60.

Figure 3A:
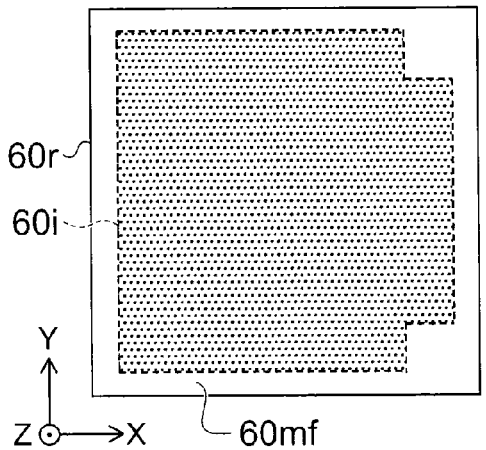
FIG. 3A to FIG. 3F are schematic plan views showing the semiconductor light emitting device according to the first embodiment.

As shown in FIG. 3A, the inner region 60*i* is provided at a portion inside the major surface 60*mf* of the metal layer 60.

Figure 3B:
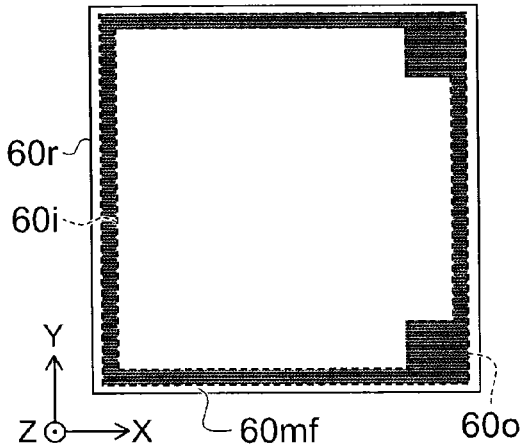

As shown in FIG. 3B, the outer region 60*o* is provided outside the inner region 60*i*.

Figure 3C:
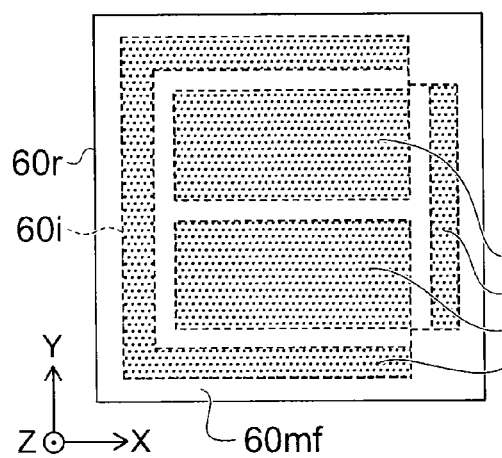
Figure 3D:
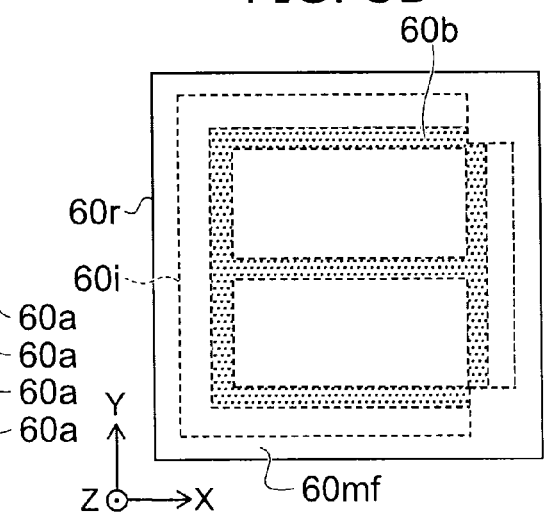

As shown in FIG. 3C and FIG. 3D, the first region 60*a* and the second region 60*b* are provided in the inner region 60*i*. In the example, the second region 60*b* includes multiple portions extending along the X-axis direction and multiple portions extending along the Y-axis direction. In other words, the second region 60*b* includes multiple portions. A portion of the first region 60*a* is disposed between the multiple portions of the second region 60*b*. On the other hand, in the example, the first region 60*a* also includes multiple portions extending along the X-axis direction and multiple portions extending along the Y-axis direction. In other words, the first region 60*a* also includes multiple portions. At least a portion of the second region 60*b* is disposed between the multiple portions of the first region 60*a*. In the example, a portion of the inner region 60*i* excluding the first region 60*a* is used as the second region 60*b*. In the example, a portion of the inner region 60*i* excluding the second region 60*b* is used as the first region 60*a*. However, the inner region 60*i* may further include a region that is different from the first region 60*a* and the second region 60*b*.

Figure 3E:
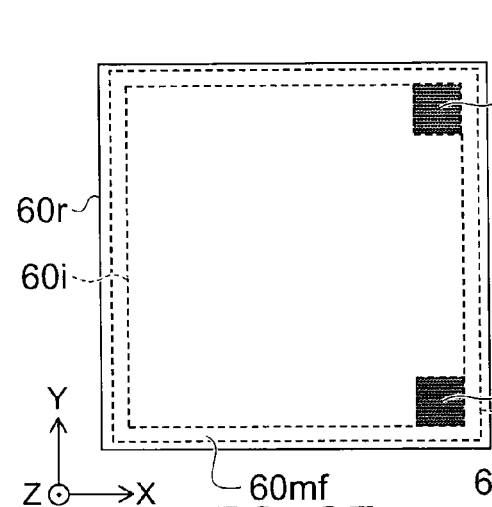
Figure 3F:
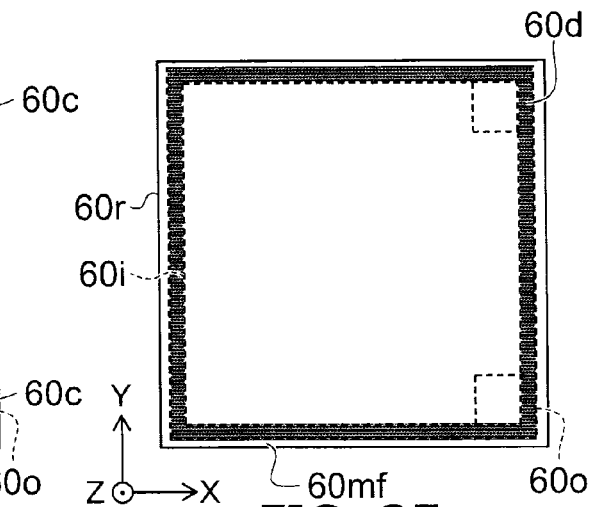

As shown in FIG. 3E and FIG. 3F, the third region 60*c* and the fourth region 60*d* are provided in the outer region 60*o*. In the example, two third regions 60*c* are provided. One of the two third regions 60*c* is provided at the vicinity of one corner portion (the corner portion where the first side 60*r*1 intersects the second side 60*r*2) of the major surface 60*mf*. The other of the two third regions 60*c* is provided at the vicinity of one other corner portion (the corner portion where the first side 60*r*1 intersects the third side 60*r*3) of the major surface 60*mf*.

At least a portion of the fourth region 60*d* is provided along the outer edge 60*r* of the major surface 60*mf*. In the example, the fourth region 60*d* has an annular configuration along the outer edge 60*r* of the major surface 60*mf*.

As shown in FIG. 3E, for example, at least a portion of the inner region 60*i* is provided between a portion (at least a portion) of the third region 60*c* and at least a portion of the fourth region 60*d* (in the example, the portion along the fourth side 60*r*4). As shown in FIG. 3F, at least a portion of the third region 60*c* is provided between at least a portion of the inner region 60*i* and at least a portion of the fourth region 60*d* (in the example, the portion along the first side 60*r*1).

FIG. 4A to FIG. 4F are schematic plan views showing the semiconductor light emitting device according to the first embodiment.

FIG. 4A to FIG. 4F show examples of the components of the semiconductor light emitting device when projected onto the X-Y plane.

FIG. 4A shows the pattern configuration of the first semiconductor layer 10.

As shown in FIG. 4A, the first semiconductor layer 10 overlaps the inner region 60*i* (the first region 60*a* and the second region 60*b*) of the major surface 60*mf* of the metal layer 60 when projected onto the X-Y plane. The first portion 11 and the second portion 12 of the first semiconductor layer 10 overlap the inner region 60*i* when projected onto the X-Y plane. In the example, a portion (the third portion 13) of the first semiconductor layer 10 overlaps the fourth region 60*d* of the outer region 60*o* (referring to FIG. 3B and FIG. 4A).

FIG. 4B shows the pattern configuration of the first conductive layer 41 and the second conductive layer 42.

As shown in FIG. 4B, the first conductive layer 41 overlaps at least a portion of the second region 60*b* of the major surface 60*mf* of the metal layer 60 when projected onto the X-Y plane. The first conductive layer 41 also overlaps at least a portion of the third region 60*c* of the major surface 60*mf*. In other words, the first conductive layer 41 extends from the inner region 60*i* (the second region 60*b*) of the major surface 60*mf* into the outer region 60*o* (the third region 60*c*). The first conductive layer 41 extends from the outer region 60*o* into the inner region 60*i*.

The second conductive layer 42 overlaps at least a portion of the fourth region 60d of the major surface 60mf of the metal layer 60 when projected onto the X-Y plane.

In the example, the second conductive layer 42 is continuous from the first conductive layer 41. A portion of a conductive film 41f, which is used to form the first conductive layer 41 and the second conductive layer 42, is provided on the second region 60b and the third region 60c and is used to form the first conductive layer 41. The portion of the conductive film 41f provided on the fourth region 60d is used to form the second conductive layer 42.

As described above relating to FIG. 3F, the fourth region 60d of the major surface 60mf of the metal layer 60 is provided along the outer edge 60r of the major surface 60mf. The second conductive layer 42 also is provided along the outer edge 60r of the major surface 60mf. For example, the second conductive layer 42 is disposed around the light emitting layer 30 (the stacked structural body 90) when projected onto the X-Y plane.

In the embodiment, the second conductive layer 42 may not always be provided continuously along the outer edge 60r. For example, at least a portion of the second conductive layer 42 may be provided along at least a portion of the outer edge 60r of the major surface 60mf. For example, at least a portion of the second conductive layer 42 is provided along at least one selected from the first to fourth sides 60r1-60r4 of the outer edge 60r. Multiple second conductive layers 42 may be provided; and the multiple second conductive layers 42 may be electrically connected to each other by a conductive member.

FIG. 4C shows the pattern configuration of the second semiconductor layer 20 and the light emitting layer 30.

As shown in FIG. 4C, the second semiconductor layer 20 and the light emitting layer 30 substantially overlap each other when projected onto the X-Y plane. The second semiconductor layer 20 and the light emitting layer 30 overlap the first region 60a of the major surface 60mf of the metal layer 60 when projected onto the X-Y plane. The second semiconductor layer 20 and the light emitting layer 30 overlap at least a portion of the inner region 60i of the major surface 60mf of the metal layer 60 when projected onto the X-Y plane.

FIG. 4D shows the pattern configuration of the second electrode 50.

As shown in FIG. 4D, the second electrode 50 overlaps at least a portion of the first region 60a of the major surface 60mf of the metal layer 60 when projected onto the X-Y plane. At least a portion of the second electrode 50 overlaps at least a portion of the second semiconductor layer 20 (referring to FIG. 4C and FIG. 4D).

FIG. 4E shows the pattern configuration of the first electrode 40 and the pad electrode 44.

As shown in FIG. 4E, the first electrode 40 overlaps at least a portion of the second region 60b of the major surface 60mf of the metal layer 60 when projected onto the X-Y plane. In other words, the first electrode 40 is provided on a portion of the inner region 60i. The pad electrode 44 overlaps at least a portion of the third region 60c of the major surface 60mf of the metal layer 60. In other words, the pad electrode 44 is provided on a portion of the outer region 60o. The pad electrode 44 is separated from the first electrode 40. The first electrode 40 disposed in the inner region 60i is electrically connected by the first conductive layer 41 to the pad electrode 44 disposed in the outer region 60o (referring to FIG. 4B and FIG. 4E).

The number of the pad electrodes 44 may be one, two, or more. The configuration of the pad electrode 44 when projected onto the X-Y plane is a rectangle, a polygon having five or more sides, a circle, a flattened circle, etc. The configuration of the pad electrode 44 may be a combination of a polygon and a circle. The configuration of the pad electrode 44 is arbitrary.

As shown in FIG. 4E, the length (a width wp) of the pad electrode 44 in a direction (e.g., the Y-axis direction) orthogonal to the extension direction of the first electrode 40 is greater than the length (a width wn) of the first electrode 40 in the direction (e.g., the Y-axis direction) orthogonal to the extension direction of the first electrode 40. For example, the length (the width) of one side of the outer edge of the pad electrode 44 is greater than the width wn of the first electrode 40. Thereby, a bonding wire can be stably connected to the pad electrode 44. The width wp of the pad electrode 44 is, for example, not less than 50 μm and not more than 200 μm, e.g., about 130 μm.

FIG. 4F shows the pattern configuration of the fifth insulating portion 85.

As shown in FIG. 4F, in the example, the fifth insulating portion 85 has an island configuration. As shown in FIG. 4E and FIG. 4F, at least a portion of the fifth insulating portion 85 is disposed between the first electrode 40 and the pad electrode 44 when projected onto the X-Y plane. As described above, the fifth insulating portion 85 is provided between a portion of the first conductive layer 41 and a portion of the first semiconductor layer 10 (a portion of the second portion 12) in the stacking direction. The fifth insulating portion 85 is provided between the second portion 12 of the first semiconductor layer 10 and a portion of the first conductive layer 41 on the pad electrode 44 side. The fifth insulating portion 85 also is provided between the second portion 12 of the first semiconductor layer 10 and a portion of the first conductive layer 41 on the pad electrode 44 side when projected onto the X-Y plane. The fifth insulating portion 85 partially blocks the injection of the carriers from the first electrode 40 to the first semiconductor layer 10 and adjusts the light emitting region. Thereby, the light emission at the vicinity of the pad electrode 44 at which the light extraction efficiency is low can be suppressed; and the luminous efficiency can be increased.

As described above, the metal layer 60, the stacked structural body 90, the first electrode 40, the pad electrode 44, the first conductive layer 41, the second conductive layer 42, the second electrode 50, and the insulating layer 80 are provided in the semiconductor light emitting device 110 according to the embodiment.

The metal layer 60 includes the major surface 60mf. The major surface 60mf includes the inner region 60i and the outer region 60o. The inner region 60i includes the first region 60a and the second region 60b. The outer region 60o is provided outside the inner region 60i. The outer region 60o includes the third region 60c and the fourth region 60d.

For example, as shown in FIG. 1A, the metal layer 60 includes an inner portion 65i (a portion that corresponds to the inner region 60i) and an outer portion 65o (a portion that corresponds to the outer region 60o). The outer portion 65o is arranged with the inner portion 65i along a direction perpendicular to the stacking direction from the metal layer 60 toward the stacked structural body 90 (i.e., the direction from the second semiconductor layer 20 toward the first semiconductor layer 10 that corresponds to the Z-axis direction). The outer portion 65o is provided outside the inner portion 65i when projected onto a plane perpendicular to the stacking direction. The inner portion 65i includes a first region portion 65a (corresponding to the first region 60a) and a second region portion 65b (a portion that corresponds to the second region 60b). The outer portion 65o includes a third region portion 65c (a portion that corresponds to the third region 60c) and a fourth region portion 65d (a portion that corresponds to the fourth region 60d). The second region portion 65b is arranged with the first region portion 65a along a direction perpendicular to the stacking direction. The fourth region portion 65d is arranged with the third region portion 65c along a direction perpendicular to the stacking direction.

The stacked structural body 90 is provided on the metal layer 60 (e.g., on the major surface 60mf). The stacked structural body 90 includes the first semiconductor layer 10 of the first conductivity type, the second semiconductor layer 20 of the second conductivity type, and the light emitting layer 30. The first semiconductor layer 10 includes the first portion 11 provided on the first region 60a (the first region portion 65a) and the second portion 12 provided on the second region 60b (the second region portion 65b). The second semiconductor layer 20 is provided between the first region 60a and the first portion 11. The light emitting layer 30 is provided between the first region 60a and the second semiconductor layer 20.

The first electrode 40 is provided between the second region 60b (the second region portion 65b) and the second portion 12. The first electrode 40 is electrically connected to the second portion 12. The pad electrode 44 is provided on the third region 60c (the third region portion 65c).

The first conductive layer 41 is provided between the second region 60b (the second region portion 65b) and the first electrode 40 and between the third region 60c (the third region portion 65c) and the pad electrode 44. The first conductive layer 41 electrically connects the first electrode 40 to the pad electrode 44. The second conductive layer 42 is provided on the fourth region 60d (the fourth region portion 65d) and is electrically connected to the first conductive layer 41.

The second electrode 50 is provided between the first region 60a (the first region portion 65a) and the second semiconductor layer 20 and is electrically connected to the second semiconductor layer 20.

The insulating layer 80 includes at least the first to third insulating portions 81-83. The first insulating portion 81 is provided between the second region 60b (the second region portion 65b) and the first conductive layer 41. The second insulating portion 82 is provided between the third region 60c (the third region portion 65c) and the first conductive layer 41. The third insulating portion 83 is provided between the fourth region 60d (the fourth region portion 65d) and the second conductive layer 42.

In the embodiment, as shown in FIG. 4B, the second conductive layer 42 is provided at a portion outside the device and is disposed around the light emitting layer 30 when projected onto the X-Y plane. Therefore, as described above, the electrostatic discharge (ESD) immunity can be increased by a field plate effect.

Further, by superimposing a portion of the second conductive layer 42 with a portion of the first semiconductor layer 10 by providing the superimposed portion 42a in the second conductive layer 42, the distance in the direction perpendicular to the Z-axis direction is short between the grounding portion which is the second conductive layer 42 and the second semiconductor layer 20 (the second electrode 50). Thereby, the field plate effect becomes more effective. Thereby, the ESD immunity increases further.

As recited above, the second conductive layer 42 overlaps the metal layer 60 with the insulating layer 80 interposed when projected onto the X-Y plane. Thereby, the electrostatic capacitance between the second conductive layer 42 and the metal layer 60 can be added to the electrostatic capacitance of the stacked structural body 90. As a result, the electrostatic capacitance of the entire semiconductor light emitting device 110 can be increased.

For example, in the case where the electrostatic capacitance between the second conductive layer 42 and the metal layer 60 is larger than the electrostatic capacitance of the stacked structural body 90, the high frequency component (e.g., the pulse current) input to the semiconductor light emitting device 110 flows mainly into the second conductive layer 42. The high frequency component that can cause ESD flows mainly into the second conductive layer 42. Thereby, the stacked structural body 90 including the light emitting layer 30 can be protected from ESD. Thereby, the breakdown voltage for ESD can be increased.

Breakdown of the LED by ESD is almost always caused by breakdown at the pn junction vicinity by heat that occurs due to localized heating caused by the power consumption when ESD is applied in the reverse direction of the pn junction (the light emitting layer 30). Accordingly, a countermeasure of ESD is possible by considering a reverse bias. The electrostatic capacitance for the reverse bias of the LED monotonously decreases because the depletion layer in the light emitting layer 30 spreads as the bias is applied. Therefore, the electrostatic capacitance of the LED after the ESD application is less than the electrostatic capacitance for zero bias. Hereinbelow, the electrostatic capacitance for zero bias is used as the electrostatic capacitance of the LED.

The inventor of the application discovered by many experiments that an electrostatic capacitance $C_1$ of a gallium nitride-based blue LED in which a grounding portion such as the second conductive layer 42 is not provided can be substantially represented by the following first formula.

$$C_1 = 80(\text{pF/m}) \times S_1(m^2)/d_1(m) \quad (1)$$

In the first formula, $S_1$ ($m^2$) is the surface area of the light emitting layer 30 when projected onto the X-Y plane. $d_1$ (m) is the thickness of the light emitting layer 30. For example, in the semiconductor light emitting device 110, in the case where the configuration of the stacked structural body 90 is a square having sides that are 0.68 mm long when projected onto the X-Y plane, the electrostatic capacitance of the device is about 400 pF.

On the other hand, an electrostatic capacitance $C_2$ between the metal layer 60 and the conductive layer (the conductive film 41f) that is used to form the first conductive layer 41 and the second conductive layer 42 is represented by the following second formula.

$$C_2 = \in_0 \in_r \times S_2/d_2 \quad (2)$$

In the second formula, $\in_0$ is the dielectric constant of a vacuum. $\in_r$ is the relative dielectric constant of the dielectric (the insulating layer 80). $S_2$ is the surface area of the region where the conductive layer opposes the metal layer 60. $d_2$ is the spacing between the conductive layer and the metal layer 60. $d_2$ corresponds to the thickness of the insulating layer 80 provided between the conductive layer and the metal layer 60.

The electrostatic capacitance $C_2$ becomes large as the width (the surface area) of the conductive layer spreads. The electrostatic capacitance $C_2$ is large in the case where the thickness of the insulating layer 80 is thin. The electrostatic capacitance $C_2$ is large in the case where the relative dielectric constant $\in_r$ of the insulating layer 80 is large. For example, the surface area of the superimposed portion 42a and the non-superimposed portion 42b of the second conductive layer 42 is increased. Thereby, the electrostatic capacitance $C_2$ between the second conductive layer 42 and the metal layer 60 can be increased.

In the example as shown in FIG. 3B and FIG. 3E, the surface area of the second conductive layer 42 when projected onto the X-Y plane is not less than twice the surface area of the portion where the first conductive layer 41 overlaps the first electrode 40 when projected onto the X-Y plane.

For example, the electrostatic capacitance $C_2$ is about 1400 pF in the case where the width of the second conductive layer 42 is 100 μm, the thickness of the insulating layer 80 is 0.2 μm, and the material of the insulating layer 80 is $TiO_2$ (having a relative dielectric constant $\in_r$ of 100). The electrostatic capacitance $C_2$ is arranged in parallel with the electrostatic capacitance $C_1$. Therefore, by providing the first conductive layer 41 and the second conductive layer 42, an electrostatic capacitance $C_{total}$ of the entire device is about $C_1+C_2=1800$ pF. The electrostatic capacitance $C_{total}$ of the entire device can be four times the electrostatic capacitance $C_1$ or more. Thus, the breakdown voltage for ESD can be increased by increasing the electrostatic capacitance of the entire device.

The width of the first conductive layer 41 and the width of the second conductive layers 42 are designed by considering, for example, the device size, the dicing street width, etc. The thickness and relative dielectric constant (i.e., the material) of the insulating layer 80 are determined such that, for example, the insulating layer 80 functions as the inter-layer insulating layer of the first electrode 40 and the second electrode 50.

As shown in FIG. 3C and FIG. 3D, the surface area of the first region 60a is greater than the surface area of the second region 60b. As shown in FIG. 4C, the surface area of the second semiconductor layer 20 and the light emitting layer 30 also is relatively large. As shown in FIG. 4D, the surface area of the second electrode 50 also is relatively large. On the other hand, as shown in FIG. 4E, the surface area of the first electrode 40 is relatively small. The surface area of the second electrode 50 is greater than the surface area of the first electrode 40. The pattern configuration of the first electrode 40 is a line configuration (e.g., a fine line configuration).

The resistivity of a p-type semiconductor layer is higher than the resistivity of an n-type semiconductor layer. The resistivity of the p-type semiconductor layer is, for example, not less than 100 times and not more than 1000 times the resistivity of the n-type semiconductor layer. In the case where the first semiconductor layer 10 is the n type and the second semiconductor layer 20 is the p type, the spread of the carriers in the first semiconductor layer 10 is wider than the spread of the carriers in the second semiconductor layer 20. The current spreads easily inside the first semiconductor layer 10 and does not spread easily inside the second semiconductor layer 20.

The surface area of the portion of the second electrode 50 contacting the second semiconductor layer 20 can be increased by setting the configuration of the first electrode 40 to have a line configuration (a fine line configuration) such as that recited above. By such a pattern configuration, the current can be spread more and the light emitting region can be expanded within the limited device surface area.

In the embodiment, it is favorable for the portion of the second conductive layer 42 on the first semiconductor layer 10 side (the portion of the second conductive layer 42 opposing the first semiconductor layer 10) to include a material having high reflectance for the emitted light. For example, at least this portion includes a material including at least one selected from aluminum (Al), silver (Ag), gold (Au), and rhodium (Rh). Thereby, the emitted light can be reflected to be efficiently emitted toward the upper surface of the device.

Also, it is favorable for the second conductive layer 42 to overlap a portion of the stacked structural body 90 when projected onto the X-Y plane. For example, a portion (the superimposed portion 42a) of the second conductive layer 42 is set to overlap the third portion 13 of the first semiconductor layer 10 when projected onto the X-Y plane. If the superimposed portion 42a is not provided, a portion of the light that propagates through the first semiconductor layer 10 is incident on the metal layer 60. The metal layer 60 includes a material having a relatively low reflectance to function sufficiently as the electrode of the device by having adhesion with the insulating layer 80, etc. Therefore, much of the light incident on the metal layer 60 is absorbed; and the efficiency decreases.

In such a case, by providing the superimposed portion 42a in the second conductive layer 42, the light that propagates through the first semiconductor layer 10 is reflected by the superimposed portion 42a and substantially does not reach the metal layer 60. Thus, the light that propagates through the first semiconductor layer 10 (the third portion 13) can be reflected to be efficiently emitted outside the device by the portion of the second conductive layer 42 on the first semiconductor layer 10 side including the material having high reflectance and by providing the superimposed portion 42a.

An example of the configuration of the semiconductor light emitting device 110 will now be described.

Figure 5:
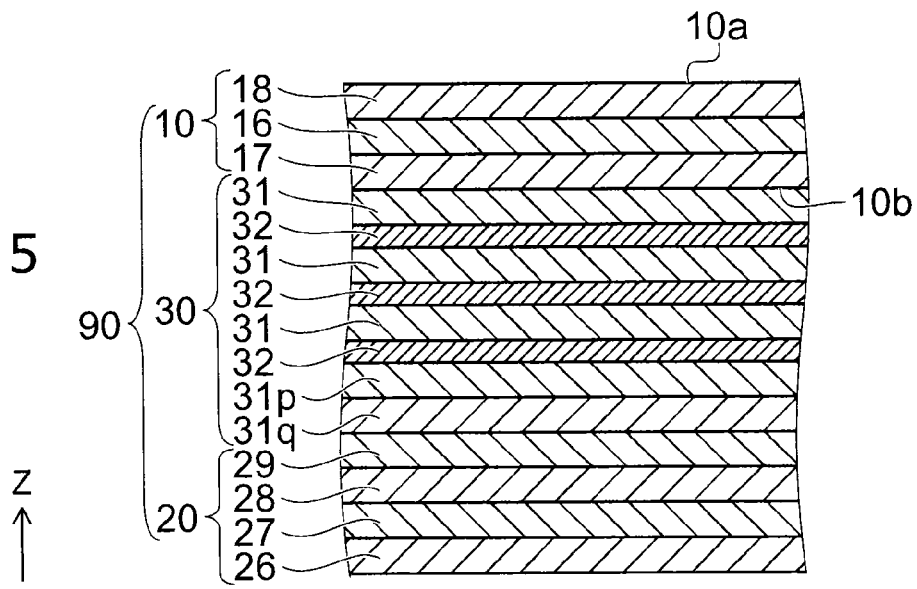
FIG. 5 is a schematic cross-sectional view showing the stacked structural body according to the first embodiment.

FIG. 5 is a schematic cross-sectional view showing the stacked structural body according to the first embodiment.

As shown in FIG. 5, the first semiconductor layer 10 includes, for example, a first n-side layer 16 and a second n-side layer 17. The second n-side layer 17 is disposed between the light emitting layer 30 and the first n-side layer 16. The first n-side layer 16 is, for example, a contact layer. The second n-side layer 17 is, for example, a clad layer. In the example, the first semiconductor layer 10 further includes a third n-side layer 18. The first n-side layer 16 is disposed between the second n-side layer 17 and the third n-side layer 18. The impurity concentration of the third n-side layer 18 is lower than the impurity concentration of the first n-side layer 16. The impurity concentration of the second n-side layer 17 is lower than the impurity concentration of the first n-side layer 16.

For example, Si-doped n-type GaN is used as the first n-side layer 16. For example, Si-doped n-type AlGaN is used as the second n-side layer 17. For example, GaN having a low impurity concentration (non-doped GaN) or the like is used as the third n-side layer 18.

The light emitting layer 30 has, for example, a multiple quantum well (MQW) structure. Multiple barrier layers 31 and multiple well layers 32 are stacked alternately in the MQW structure. For example, one barrier layer 31 is disposed between the well layer 32 and the first semiconductor layer 10. A p-side barrier layer 31p is provided between the second semiconductor layer 20 and the well layer 32. The light emitting layer 30 may further include a spacer layer 31q. The spacer layer 31q is disposed between the second semiconductor layer 20 and the p-side barrier layer 31p.

For example, Si-doped n-type AlGaN (e.g., Si-doped n-type $Al_{0.11}Ga_{0.89}N$) is used as the barrier layer 31. For example, InGaN is used as the well layer 32. For example, $Al_{0.11}Ga_{0.89}N$ is used as the p-side barrier layer 31p.

The second semiconductor layer 20 includes, for example, a first p-side layer 26, a second p-side layer 27, a third p-side layer 28, and a fourth p-side layer 29. The second p-side layer 27 is disposed between the first p-side layer 26 and the light emitting layer 30. The third p-side layer 28 is disposed between the second p-side layer 27 and the light emitting layer 30. The fourth p-side layer 29 is disposed between the third p-side layer 28 and the light emitting layer 30.

The fourth p-side layer 29 includes, for example, non-doped AlGaN. The third p-side layer 28 includes, for example, Mg-doped p-type AlGaN. The second p-side layer 27 includes, for example, Mg-doped p-type GaN. The first p-side layer 26 includes, for example, high-concentration Mg-doped p-type GaN. The first p-side layer 26 is, for example, a p-side contact layer.

The first semiconductor layer 10, the second semiconductor layer 20, and the light emitting layer 30 include a nitride semiconductor. A gallium nitride compound semiconductor such as, for example, $Al_xGa_{1-x-y}In_yN$ (x≥0, y≥0, and x+y≥1), etc., is used as the nitride semiconductor. The light emission wavelength from the light emitting layer may be selected from a range not less than 210 nm and not more than 650 nm.

As described above, the first major surface 10a of the first semiconductor layer 10 includes the unevenness 10dp. The unevenness 10dp includes the multiple protrusions 10p. The spacing between adjacent protrusions 10p of the multiple protrusions 10p is, for example, not less than the light emission wavelength (the peak wavelength) of the light emitted from the light emitting layer 30. Here, the light emission wavelength is the wavelength inside the first semiconductor layer 10.

In the case where the spacing between the protrusions 10p is shorter than the light emission wavelength, the light incident on the unevenness 10dp has behavior at the surface of the unevenness 10dp such as scattering, diffraction, etc., that are explained by wave optics. Therefore, a portion of the light is no longer extracted. Further, in the case where the spacing between the protrusions 10p is sufficiently shorter than the light emission wavelength, the unevenness 10dp can be considered to be a surface for which the refractive index changes continuously. Therefore, this is similar to a flat surface without an unevenness; and the effect of increasing the light extraction efficiency is small.

The planar configuration of the protrusion 10p of the unevenness 10dp provided in the first major surface 10a is, for example, a hexagon. The spacing between the adjacent protrusions 10p corresponds to the spacing between two opposing vertexes of the hexagons. For example, the unevenness 10dp is formed by anisotropic etching of the first semiconductor layer 10 using a KOH solution. The light emitted from the light emitting layer 30 has Lambertian reflectance at the interface between the first semiconductor layer 10 and the external environment due to such an unevenness 10dp.

The unevenness 10dp may be formed by dry etching using a mask. By such a method, the unevenness 10dp can be formed as designed. Therefore, it is easy to increase the light extraction efficiency, the uniformity, and the reproducibility.

Figure 6A:
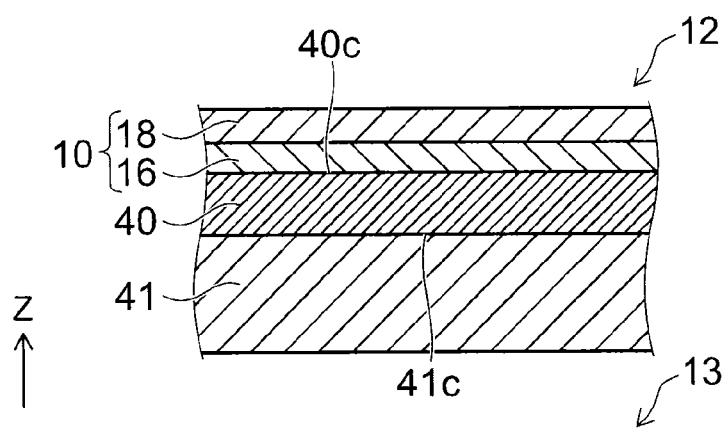
FIG. 6A to FIG. 6C are schematic cross-sectional views showing a portion of the semiconductor light emitting device according to the first embodiment.
Figure 6B:
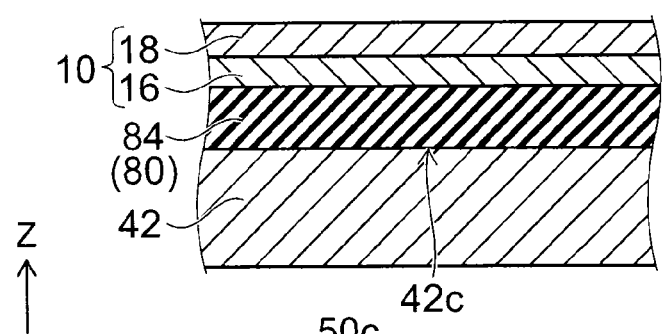
Figure 6C:
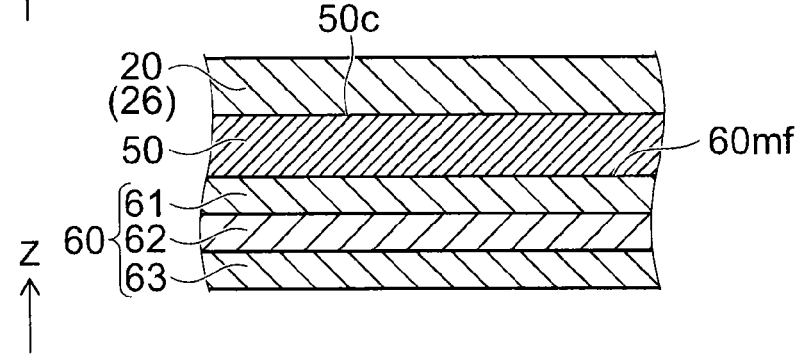

FIG. 6A to FIG. 6C are schematic cross-sectional views showing a portion of the semiconductor light emitting device according to the first embodiment.

FIG. 6A shows an example of the first electrode 40, the first semiconductor layer 10, and the first conductive layer 41.

As shown in FIG. 6A, the first electrode 40 contacts the first n-side layer 16 (e.g., the contact layer) of the first semiconductor layer 10. The first electrode 40 contacts the second portion 12 of the first semiconductor layer 10. The first electrode 40 has, for example, an ohmic contact with the first semiconductor layer 10.

The first electrode 40 has a portion 40c that opposes the first semiconductor layer 10 (the second portion 12). The portion 40c contacts, for example, the first semiconductor layer 10. The portion 40c of the first electrode 40 opposing the first semiconductor layer 10 includes, for example, at least one selected from titanium (Ti) and aluminum (Al). The portion 40c includes, for example, a conductive transparent oxide (e.g., ITO). These materials have good ohmic characteristics with the n-type semiconductor layer. The optical reflectance is low for these materials.

The portion 40c may include at least one selected from aluminum (Al), silver (Ag), gold (Au), and rhodium (Rh). The optical reflectance is high for these materials. The light extraction efficiency from the semiconductor light emitting device can be increased by increasing the reflectance of the first electrode 40.

As shown in FIG. 6A, the first conductive layer 41 has a portion 41c (the portion on the upper side) on the side opposing the first electrode 40. The portion 41c is the portion of the first conductive layer 41 on the first electrode 40 and first semiconductor layer 10 side. The portion 41c includes, for example, at least one selected from aluminum (Al), silver (Ag), gold (Au), and rhodium (Rh). The light extraction efficiency can be increased further by the portion 41c including such a reflective metal.

FIG. 6B shows an example of the fourth insulating portion 84, the first semiconductor layer 10, and the second conductive layer 42.

As shown in FIG. 6B, the second conductive layer 42 (or a portion of the second conductive layer 42) opposes the third portion 13 of the first semiconductor layer 10. At least the fourth insulating portion 84 (a portion of the insulating layer 80) is disposed between the second conductive layer 42 and the third portion 13. The second conductive layer 42 includes a portion 42c (e.g., the upper portion) that opposes the first semiconductor layer 10. The portion 42c includes at least one selected from aluminum (Al), silver (Ag), gold (Au), and rhodium (Rh). The light extraction efficiency can be increased further by the portion 42c including such a reflective metal.

The second conductive layer 42 is formed simultaneously with, for example, the first conductive layer 41. In the embodiment, the second conductive layer 42 may be formed separately from the first conductive layer 41.

FIG. 6C shows the second electrode 50, the second semiconductor layer 20, and the metal layer 60.

As shown in FIG. 6C, the second electrode 50 includes a portion 50c that opposes the second semiconductor layer 20. The portion 50c contacts, for example, the second semiconductor layer 20. The portion 50c includes, for example, Ag.

The reflection efficiencies of metals other than Ag tend to decrease as the wavelength shortens into the ultraviolet region of 400 nm or less. Conversely, Ag has high reflecting efficiency characteristics even for light of the ultraviolet band in the range not less than 370 nm and not more than 400 nm. Therefore, in an ultraviolet light-emitting semiconductor light emitting device, it is favorable for the portion 50c of the second electrode 50 opposing the second semiconductor layer 20 to include silver. For example, it is favorable for the Ag component ratio of the portion 50c of the second electrode 50 opposing the second semiconductor layer 20 to be higher than the Ag component ratio of the portions other than the second electrode 50. The thickness of the second electrode 50 is, for example, not less than 100 nm. Thereby, a high reflection efficiency for the light is obtained. Thereby, the reflectance at the interface between the second electrode 50 and the second semiconductor layer 20 increases. Thereby, the external extraction efficiency of the light of the semiconductor light emitting device 110 increases.

As shown in FIG. 6C, the metal layer 60 includes, for example, a Ti layer 61, a Pt layer 62, and a Au layer 63. The Pt layer 62 is disposed between the Au layer 63 and the second electrode 50. The Ti layer 61 is disposed between the Pt layer 62 and the second electrode 50. The Ti layer 61 contacts, for example, the second electrode 50.

Figure 7:
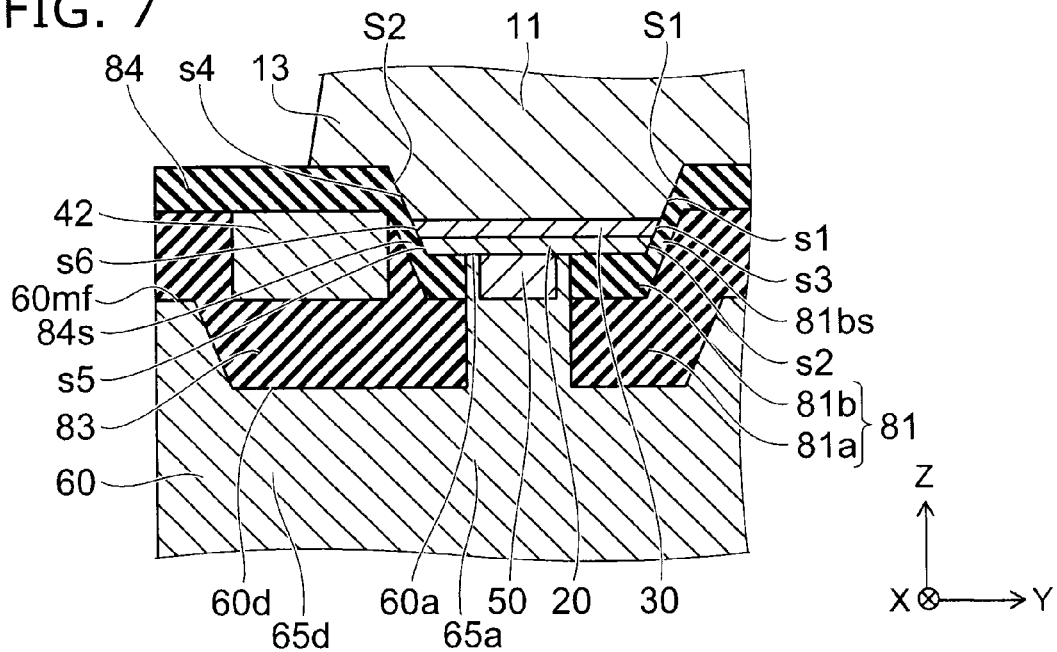
FIG. 7 is a schematic cross-sectional view showing the semiconductor light emitting device according to the first embodiment.

FIG. 7 is a schematic cross-sectional view showing the semiconductor light emitting device according to the first embodiment.

FIG. 7 is an enlarged view of a region of the semiconductor light emitting device 110 including the light emitting layer 30.

In the example as shown in FIG. 7, the first insulating portion 81 includes the first film portion 81a and the second film portion 81b. The first film portion 81a is disposed between the second film portion 81b and the metal layer 60. The first film portion 81a contacts, for example, the metal layer 60. The second film portion 81b contacts the stacked structural body 90. The boundary between the first film portion 81a and the second film portion 81b may be observed in some cases and may not be observed in some cases.

The second film portion 81b of the first insulating portion 81 includes a first side surface portion 81bs. The first side surface portion 81bs is provided, for example, along a first side surface s1 of the first portion 11 of the first semiconductor layer 10. The first side surface portion 81bs also is provided along a second side surface s2 of the second semiconductor layer 20. The first side surface portion 81bs also is provided along a third side surface s3 of the light emitting layer 30. The first side surface portion 81bs electrically insulates the first side surface s1 from the metal layer 60, the second side surface s2 from the metal layer 60, and the third side surface s3 from the metal layer 60.

In the example, the fourth insulating portion 84 includes a second side surface portion 84s. The second side surface portion 84s is provided along a fourth side surface s4 of the first portion 11 of the first semiconductor layer 10. The second side surface portion 84s also is provided along a fifth side surface s5 of the second semiconductor layer 20. The second side surface portion 84s also is provided along a sixth side surface s6 of the light emitting layer 30. The second side surface portion 84s electrically insulates the fourth side surface s4 from the metal layer 60, the fifth side surface s5 from the metal layer 60, and the sixth side surface s6 from the metal layer 60.

The first insulating portion 81, the second insulating portion 82, the third insulating portion 83, the fourth insulating portion 84, and the fifth insulating portion 85 (referring to FIG. 1A) include, for example, the same material. In the embodiment, the first insulating portion 81, the second insulating portion 82, the third insulating portion 83, the fourth insulating portion 84, and the fifth insulating portion 85 may include mutually-different materials. The interfaces between the insulating portions may be observed in some cases and may not be observed in some cases. The insulating layer 80 includes, for example, $SiO_2$. The thickness of the insulating layer 80 is not less than 10 nm and not more than 2000 nm, e.g., about 400 nm.

The first insulating portion 81 and the fourth insulating portion 84 of the insulating layer 80 function as protective layers of the stacked structural body 90. In particular, the first insulating portion 81 and the fourth insulating portion 84 protect the exposed portion (the side) of the light emitting layer 30. Thereby, degradation and leaks of the semiconductor light emitting device 110 are suppressed. The thickness of the fourth insulating portion 84 is, for example, not less than 100 nm and not more than 2000 nm, e.g., about 600 nm.

The pad electrode 44 is disposed to be separated from the first electrode 40. At least the fifth insulating portion 85 is provided between the pad electrode 44 and the first electrode 40 when projected onto the X-Y plane. Thereby, for example, the injection region of the electrons from the first electrode 40 being concentrated in the portion of the first electrode 40 on the pad electrode 44 side is suppressed. For example, the formation of a region where the electrons concentrate on the side of the first electrode 40 where the pad electrode 44 is disposed is suppressed.

Figure 8:
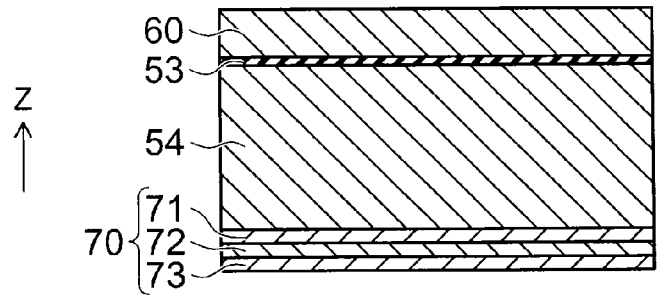
FIG. 8 is a schematic cross-sectional view showing a portion of the semiconductor light emitting device according to the first embodiment.

FIG. 8 is a schematic cross-sectional view showing a portion of the semiconductor light emitting device according to the first embodiment. FIG. 8 shows the metal layer 60, the bonding layer 53, the support substrate 54, and the back surface electrode 70.

The support substrate 54 is disposed between the back surface electrode 70 and the metal layer 60. The bonding layer 53 is disposed between the support substrate 54 and the metal layer 60. The metal layer 60 is disposed between the support substrate 54 and the stacked structural body 90.

The support substrate 54 is, for example, conductive. The back surface electrode 70 is electrically connected to the second electrode 50 via the support substrate 54, the bonding layer 53, and the metal layer 60. The support substrate 54 includes, for example, a semiconductor substrate such as Si, Ge, etc. The support substrate 54 includes, for example, a metal substrate such as CuW, Cu, etc. A plating layer may be used as the support substrate 54. In the case where the plating layer is used, for example, the bonding layer 53 can be omitted. Thereby, there is no thermal history in the bonding process. The cost decreases; and thermal degradation can be suppressed.

At least a portion of the support substrate 54 is conductive. A resin layer, a silicon substrate, etc., including a metal interconnect may be used as the support substrate 54. The surface area of the support substrate 54 is, for example, not less than the surface area of the first semiconductor layer 10.

The bonding layer 53 includes a material that is different from that of the metal layer 60. The bonding layer 53 includes, for example, solder of a AuSn alloy.

The back surface electrode 70 is electrically connected to the support substrate 54. The back surface electrode 70 includes, for example, a Ti layer 71, a Pt layer 72, and a Au layer 73. The Pt layer 72 is disposed between the Au layer 73 and the support substrate 54. The Ti layer 71 is disposed between the Pt layer 72 and the support substrate 54. The thickness of the back surface electrode 70 is, for example, not less than 200 nm and not more than 2000 nm, e.g., about 800 nm.

The second electrode 50 and the support substrate 54 are electrically connected to each other. The support substrate 54 overlaps the first electrode 40 when projected onto the X-Y plane. The first electrode 40 having the line configuration extends from the pad electrode 44. The first electrode 40 does not obstruct the electrical connection between the second electrode 50 and the support substrate 54.

The semiconductor light emitting device 110 may further include a sealing unit covering the stacked structural body 90. The sealing unit includes, for example, a resin. The sealing unit may include a wavelength conversion unit. The wavelength conversion unit converts, for example, the light emitted from the light emitting layer 30 into light of a wavelength that is different from the wavelength of the light emitted from the light emitting layer 30.

An example of a method for manufacturing the semiconductor light emitting device 110 will now be described.

For example, a first semiconductor film, a light emitting film, and a second semiconductor film are grown as a crystal in order on a growth substrate such as sapphire, etc. The first semiconductor film is used to form the first semiconductor layer 10. The light emitting film is used to form the light emitting layer 30. The second semiconductor film is used to form the second semiconductor layer 20. Thereby, a stacked structure film is formed on the growth substrate.

For example, metal organic chemical vapor deposition is used to form the stacked structure film. A method such as molecular beam epitaxy, etc., may be used to form the stacked structure film.

An example of the formation of the stacked structural body 90 will now be described.

For example, a first buffer layer, a second buffer layer, and a third buffer layer are formed sequentially as buffer layers on a growth substrate having a c-plane sapphire surface. The first buffer layer is, for example, a first AlN buffer layer having a high carbon concentration. The carbon concentration of the first buffer layer is, for example, not less than $3\times10^{18}$ cm$^{-3}$ and not more than $5\times10^{20}$ cm$^{-3}$; and the thickness of the first buffer layer is, for example, not less than 3 nm and not more than 20 nm. The second buffer layer is, for example, a high-purity second AlN buffer layer. The carbon concentration of the second buffer layer is, for example, not less than $1\times10^{16}$ cm$^{-3}$ and not more than $3\times10^{18}$ cm$^{-3}$; and the thickness of the second buffer layer is, for example, 2 μm. The third buffer layer is, for example, a non-doped GaN buffer layer. The thickness of the third buffer layer is, for example, 2 μm. The first buffer layer and the second buffer layer are, for example, monocrystalline aluminum nitride. A high-quality semiconductor layer can be formed in the crystal growth described below by using the monocrystalline aluminum nitride as the first buffer layer and the second buffer layer; and damage of the crystal is drastically reduced.

The first n-side layer 16 and the second n-side layer 17 are formed sequentially in this order on the buffer layer. The first n-side layer 16 is, for example, a Si-doped n-type GaN contact layer. The Si concentration of the first n-side layer 16 is, for example, not less than $1\times10^{18}$ cm$^{-3}$ and not more than $5\times10^{19}$ cm$^{-3}$; and the thickness of the first n-side layer 16 is, for example, 6 μm. The second n-side layer 17 is, for example, a Si-doped n-type $Al_{0.10}Ga_{0.90}N$ clad layer. The Si concentration of the second n-side layer 17 is, for example, $1\times10^{18}$ cm$^{-3}$; and the thickness of the second n-side layer 17 is, for example, 0.02 μm. The first n-side layer 16 and the second n-side layer 17 are used to form the first semiconductor layer 10. For convenience, the entire buffer layer or a portion of the buffer layer may be included in the first semiconductor layer 10. For example, the third buffer layer is used to form the third n-side layer 18.

For example, a low temperature growth $Al_xGa_{1-x}N$ ($0 \leq x \leq 1$) may be used as the buffer layer formed on the growth substrate.

The barrier layer 31 is stacked alternately with the well layer 32 as the light emitting film (the light emitting layer 30) on the first semiconductor film (the first semiconductor layer 10). For example, Si-doped n-type $Al_{0.11}Ga_{0.89}N$ is used as the barrier layer 31. InGaN is used as the well layer 32. The number of stacks of the barrier layer 31 and the well layer 32 is not less than one period and not more than thirty periods, e.g., three periods. Further, an $Al_{0.11}Ga_{0.89}N$ layer is stacked as the p-side barrier layer 31p. The Si concentration of the barrier layer 31 is, for example, not less than $1.1\times10^{19}$ cm$^{-3}$ and not more than $1.5\times10^{19}$ cm$^{-3}$. The Si concentration of the p-side barrier layer 31p is, for example, not less than $1.1\times10^{19}$ cm$^{-3}$ and not more than $1.5\times10^{19}$ cm$^{-3}$; and the thickness of the p-side barrier layer 31p is, for example, 0.01 μm. The thickness of the light emitting film is, for example, not less than 0.01 μm and not more than 0.15 μm (e.g., 0.075 μm). Subsequently, a Si-doped n-type $Al_{0.11}Ga_{0.89}N$ layer is formed as the spacer layer 31q. The Si concentration of the spacer layer 31q is, for example, not less than $0.8\times10^{19}$ cm$^{-3}$ and not more than $1.0\times10^{19}$ cm$^{-3}$; and the thickness of the spacer layer 31q is, for example, 0.01 μm. In the configuration recited above, the wavelength (the peak wavelength) of the light emitted by the light emitting layer 30 is, for example, 395 nm. The wavelength is, for example, not less than 210 nm and not more than 650 nm. The wavelength may be in a range not more than 370 nm and not more than 480 nm.

The second semiconductor film (the second semiconductor layer 20) is formed on the light emitting film (the light emitting layer 30). For example, the fourth p-side layer 29, the third p-side layer 28, the second p-side layer 27, and the first p-side layer 26 are formed sequentially in this order. The fourth p-side layer 29 includes, for example, a non-doped $Al_{0.11}Ga_{0.89}N$ spacer layer. The thickness of the fourth p-side layer 29 is, for example, 0.02 μm. The third p-side layer 28 includes, for example, a Mg-doped p-type $Al_{0.28}Ga_{0.72}N$ clad layer. The Mg concentration of the third p-side layer 28 is, for example, $1\times10^{19}$ cm$^{-3}$; and the thickness of the third p-side layer 28 is, for example, 0.02 μm. For example, a Mg-doped p-type GaN contact layer is used as the second p-side layer 27. The Mg concentration of the second p-side layer 27 is, for example, $1\times10^{19}$ cm$^{-3}$; and the thickness of the second p-side layer 27 is, for example, 0.4 μm. A high-concentration Mg-doped p-type GaN contact layer is used as the first p-side layer 26. The Mg concentration of the first p-side layer 26 is, for example, $5\times10^{19}$ cm$^{-3}$; and the thickness of the first p-side layer 16 is, for example, 0.02 μm.

The compositions, composition ratios, types of impurities, impurity concentrations, and thicknesses recited above are examples; and various modifications are possible.

The ohmic characteristics with the second electrode 50 can be improved by setting the Mg concentration of the first p-side layer 26 (the contact layer) to be high, i.e., about $1\times10^{20}$ cm$^{-3}$ (e.g., not less than $0.9\times10^{19}$ cm$^{-3}$ and not more than $3\times10^{20}$ cm$^{-3}$).

Unlike that of a semiconductor laser diode, the distance between the first p-side layer 26 and the light emitting layer 30 is short in a semiconductor light emitting diode. Therefore, there are cases where the characteristics degrade due to Mg diffusion. By increasing the contact surface area between the second electrode 50 and the first p-side layer 26, the current density in the operation is reduced. Thereby, the Mg concentration of the first p-side layer 26 can be suppressed to about $1\times10^{19}$ cm$^{-3}$ and the diffusion of the Mg can be prevented without a large loss of the electrical characteristics. Thereby, the light emission characteristics can be improved.

Differences between the crystal types of the first buffer layer and the growth substrate are relaxed; and in particular, screw dislocations are reduced. The surface of the second buffer layer is planarized at the atomic level. Therefore, crystal defects of the third buffer layer (e.g., the non-doped GaN buffer layer) that is grown on the second buffer layer are reduced. It is favorable for the thickness of the second buffer layer to be thicker than 1 μm. Thereby, for example, the crystal defects can be reduced sufficiently. It is desirable for the thickness of the second buffer layer to be 4 μm or less. Thereby, for example, warp due to strain can be suppressed. The second buffer layer may include $Al_xGa_{1-x}N$ ($0.8 \leq x \leq 1$). Thereby, the warp of the growth substrate can be relaxed.

The third buffer layer is grown in a three-dimensional island configuration on the second buffer layer. The third buffer layer reduces crystal defects. It is desirable for the average thickness of the third buffer layer to be not less than 2 μm. Thereby, the flatness of the surface of the crystal improves. It is favorable for the thickness of the third buffer layer to be not less than 2 μm and not more than 10 μm.

Thereby, the reproducibility of the crystal quality can be improved; and the warp can be reduced effectively.

By employing these buffer layers, the crystal defects can be reduced to be about 1/10 of the case where a low temperature growth AlN buffer layer is employed. By this technology, high-concentration Si doping of the n-type GaN contact layer is possible. A semiconductor light emitting device having a high efficiency even for ultraviolet band light emission is obtained. By reducing the crystal defects of the third buffer layer (which is the non-doped GaN buffer layer, e.g., the third n-side layer 18), the absorption of the light by the third buffer layer is suppressed.

In the case where a gallium nitride compound semiconductor of AlGaInN is used as the quantum well layer, for example, a light emission of a wavelength (a peak wavelength) from 210 nm to 650 nm is obtained. In the case where a gallium nitride compound semiconductor of GaInN is used as the quantum well layer, for example, a light emission of a wavelength (a peak wavelength) from 370 nm to 650 nm is obtained.

As recited above, the stacked structure film that is used to form the stacked structural body 90 is obtained. A recess (trench) is made in a portion of the stacked structure film. The recess is made from the upper surface (the surface on the second semiconductor film side) of the stacked structure film to reach the first semiconductor film. The first semiconductor film is exposed at the bottom portion of the recess.

For example, to make the recess, a mask is formed on the upper surface of the stacked structure film; and, for example, dry etching is performed. It is favorable for the angle of the side surface of the recess (the angle between the X-Y plane and the side surface of the recess) to be, for example, not less than 60 degrees. This angle corresponds to the angle at which the light emitted at 30 degrees from the light emitting layer 30 which has the maximum intensity is reflected such that the travel direction is reflected toward the reverse direction. It is easy to increase the light extraction efficiency by increasing the depth of the recess to change the travel direction of the emitted light that propagates in the lateral direction through the stacked structural body 90. On the other hand, in the case where the depth of the recess is too deep, it becomes difficult to fill the recess with solder when bonding the support substrate 54 in a subsequent process. Moreover, in the case where the recess is deep enough to reach the third buffer layer (e.g., the third n-side layer 18), the first electrode 40 can no longer be formed on the first n-side layer 16 (e.g., the contact layer). It is favorable for the depth of the recess to be, for example, not less than 0.2 μm and not more than 10 μm. The depth of the recess may be, for example, not less than 0.3 μm and not more than 1.5 μm.

A first insulating film is formed to cover the surface of the stacked structural body 90 that has the recess. The first insulating film is used to form a portion (the second film portion 81*b*) of the first insulating portion 81, the fourth insulating portion 84, the fifth insulating portion 85, and the sixth insulating portion 86. Thus, the portion of the first insulating portion 81, the fourth insulating portion 84, the fifth insulating portion 85, and the sixth insulating portion 86 are formed simultaneously. For example, SiO$_2$ is used as the first insulating film. The thickness of the first insulating film is, for example, not less than 200 nm and not more than 1500 nm (e.g., 400 nm).

It is favorable for the first insulating film to be formed at a high temperature. Thereby, the insulating layer 80 formed from the first insulating film is a high-quality film having excellent insulative properties, coverage, reliability, etc.

The first electrode 40 is formed in contact with the first semiconductor layer 10. For example, the portion of the first insulating film at a portion of the recess made on the first semiconductor layer 10 is removed. A stacked film of Ti/Al/Ni/Au that is used to form an ohmic electrode is formed at the surface of the first semiconductor layer 10 that is exposed. The thickness of the stacked film is, for example, not less than 150 nm and not more than 500 nm (e.g., 300 nm). For example, sintering is performed for 5 minutes at 600° C. in a nitrogen atmosphere. The first electrode 40 is an ohmic electrode.

A conductive film that is used to form the first conductive layer 41 and the second conductive layer 42 is formed on the first electrode 40. The conductive film includes, for example, a stacked film of Ti/Au/Ti. The thickness of the conductive film is, for example, not less than 800 nm and not more than 2000 nm (e.g., 1200 nm).

A highly reflective material such as, for example, Al, Ag, Au, Rh, etc., may be used as a first layer included in the first electrode 40. The first layer is a layer that contacts the first semiconductor layer 10. Thereby, high reflectance is obtained while obtaining good ohmic characteristics with the n-type contact layer and low contact characteristics with the n-type contact layer. The light extraction efficiency is easy to increase. The design degrees of freedom of the first electrode 40 increase. Because Al has poor environmental resistance, for example, the reliability and the adhesion can be improved by employing an Al alloy including a slight amount of Si.

The first electrode 40 which is the ohmic electrode may be formed separately from the first conductive layer 41 and the second conductive layer 42. A film structure and heat treatment conditions that provide low contact resistance are applicable to the first electrode 40. A film structure having a low resistivity is applicable to the first conductive layer 41 and the second conductive layer 42. For example, the contact resistance of the first electrode 40 is reduced by high-temperature sintering. The first conductive layer 41 and the second conductive layer 42 include a thick film of at least one selected from Au, Al, and Ag. Thereby, the resistivities of the first conductive layer 41 and the second conductive layer 42 can be reduced.

A second insulating film is formed to cover the first conductive layer 41, the second conductive layer 42, and the first insulating film. The second insulating film is used to form a portion (the first film portion 81*a*) of the first insulating portion 81, the second insulating portion 82, and the third insulating portion 83. Thus, the portion (the first film portion 81*a*) of the first insulating portion 81, the second insulating portion 82, and the third insulating portion 83 are formed simultaneously. For example, SiO$_2$ is used as the second insulating film. The thickness of the second insulating film is, for example, not less than 200 nm and not more than 3000 nm (e.g., 600 nm).

The second insulating film can be formed at a high temperature. Because the sintering of the first electrode 40 that is formed previously is performed at about 600° C., the first electrode 40 has thermal stability up to similar heat treatment conditions. Accordingly, even in the case where the second insulating film is formed at a high temperature, the ohmic properties and contact resistance of the first electrode 40 do not degrade. Thereby, the insulating layer 80 formed from the second insulating film is a high-quality film having excellent coverage, reliability, insulative properties between the first electrode 40 and the second electrode 50, etc.

The second insulating film may be formed at a low temperature. Low resistivities of the first conductive layer 41 and the second conductive layer 42 can be maintained by forming the second insulating film at a temperature such that the first conductive layer 41 and the second conductive layer 42, which are formed previously, are not alloyed. Thereby, a semiconductor light emitting device having good current spreading, an effectively large light emission surface area, and a high luminous efficiency can be realized.

The second electrode 50 having ohmic characteristics is formed. For example, portions of the first insulating film and the second insulating film that are formed on the second semiconductor layer 20 are removed. A stacked film of Ag/Pt is formed on the surface of the portion of the second semiconductor layer 20 that is exposed. The thickness of the stacked film is, for example, 200 nm. Then, sintering is performed for one minute at about 400° C. in an oxygen atmosphere. Thereby, the second electrode 50 is formed.

A metal film that is used to form the metal layer 60 is formed on the second electrode 50. The metal film includes, for example, a stacked film of Ti/Pt/Au. The thickness of the stacked film is, for example, 800 nm.

The support substrate 54 is prepared. The support substrate 54 includes, for example, a Si substrate. The bonding layer 53 is provided on the major surface of the support substrate 54. The bonding layer 53 is, for example, a solder layer of a AuSn alloy. The thickness of the solder layer is, for example, not less than 0.5 μm and not more than 5 μm (e.g., 1.5 μm). The metal layer 60 and the solder layer are caused to oppose each other and are heated to a temperature (e.g., 280° C.) that is not less than the eutectic point of the solder. The support substrate 54 is bonded to the metal layer 60.

Laser light is irradiated onto the stacked structural body 90 from the growth substrate side to peel the growth substrate. The laser light includes, for example, the third harmonic (355 nm) or the fourth harmonic (266 nm) of a YVO$_4$ solid-state laser. The laser light has a wavelength that is shorter than the bandgap wavelength based on the bandgap of the GaN of the GaN buffer layer (e.g., the non-doped GaN buffer layer recited above). In other words, the laser light has an energy that is higher than the bandgap of the GaN.

The laser light is efficiently absorbed in the region of the GaN buffer layer (the non-doped GaN buffer layer) on the monocrystalline buffer layer (second buffer layer) side. Thereby, the GaN of the GaN buffer layer on the monocrystalline buffer layer side is decomposed by heat generation. The GaN that is decomposed is removed by hydrochloric acid treatment, etc.; and the growth substrate is peeled.

Crystal defects and damage occur easily in the crystal when bonding the support substrate 54 and when peeling the growth substrate. This is due to the coefficient of thermal expansion difference between the support substrate 54 and the sapphire, the coefficient of thermal expansion difference between the support substrate 54 and the GaN, the heat due to being heated locally, the products that are produced by the GaN decomposing, etc. In the case where crystal defects and/or damage occur, the Ag of the second electrode 50 diffuses inside the crystal which may cause an accelerated increase of leaks and/or crystal defects in the crystal interior.

A high-quality semiconductor layer can be formed by using the monocrystalline AlN buffer layer. The damage of the crystal is drastically reduced. The AlN buffer layer having high thermal conduction characteristics is proximal to the GaN. Therefore, the heat is easily diffused when decomposing the GaN by the laser light; and the thermal damage due to localized heat can be suppressed.

Then, the unevenness 10$dp$ is formed on the first major surface (the first major surface 10$a$ of the first semiconductor layer 10) of the stacked structural body 90 that is exposed. Also, the pad electrode 44 is formed.

For example, a portion of the stacked structural body 90 is removed by dry etching to expose a portion of the fourth insulating portion 84, a portion of the fifth insulating portion 85, and the sixth insulating portion 86. For example, the surface of the non-doped GaN buffer layer (the third n-side layer 18) is exposed at the first major surface of the stacked structural body 90.

Then, the unevenness 10$dp$ is formed by patterning the surface of the non-doped GaN buffer layer by, for example, alkaline etching using a KOH solution. For example, etching is performed for 20 minutes using a KOH solution of 1 mole (mol)/liter (L) at 80° C. Thereby, the unevenness 10$dp$ is formed.

In the case where the third n-side layer 18 is not provided, the unevenness 10$dp$ is formed in the first n-side layer 16 (the n-type contact layer). The carrier concentration (e.g., the impurity concentration) of the n-type contact layer is set to be high to form a low resistance ohmic contact with the n-side electrode (the first electrode 40). In the case where an unevenness and/or a flat portion is formed in such an n-type contact layer, surface roughness and impurity precipitation occur easily. As a result, there are cases where these cause the light extraction efficiency to decrease. On the other hand, the impurity concentration of the non-doped GaN buffer layer is lower than that of the n-type contact layer. Therefore, surface roughness and impurity precipitation do not occur very much.

The unevenness 10$dp$ may be formed by dry etching.

In alkaline etching, anisotropic etching is performed along the plane orientation (mainly {10-1-1}) of the GaN crystal; and as a result, a hexagonal pyramid structure is formed. The etching rate and the size and density of the hexagonal pyramid change greatly due to the etching temperature, the etching time, the power of hydrogen (pH) which is adjusted by adding other substances, the concentration, the irradiation/non-irradiation of ultraviolet (UV) light or a UV laser, etc.

As the etching amount increases, the unevenness 10$dp$ becomes large and the density of the unevenness 10$dp$ increases.

In the case where GaN is patterned by dry etching, the N (nitrogen) surface is unlike the Ga surface in that the N (nitrogen) surface is easily affected by the crystal orientation and dislocations and is easily subjected to anisotropic etching. Normally, the surface of GaN that is grown on the c-plane sapphire substrate is the Ga surface. By removing the sapphire substrate, the surface of the GaN that is exposed is the N (nitrogen) surface. Accordingly, it is easy to form the unevenness 10$dp$ by anisotropic etching using dry etching. As described above, the unevenness 10$dp$ may be formed by dry etching using a mask.

According to experimental results using a semiconductor light emitting device having an emitted light of a wavelength of 390 nm (a light emission wavelength inside the crystal layer of about 155 nm), the light output increases as the size of the unevenness 10$dp$ increases. The increase of the light output is observed when the size of the unevenness 10$dp$ is not less than about 3 μm. It is favorable for the size of the unevenness 10$dp$ to be not less than twice the light emission wavelength inside the crystal layer, and more favorable to be not less than 10 times the light emission wavelength inside the crystal layer.

A portion of the fifth insulating portion 85 that covers the first conductive layer 41 is removed. The pad electrode 44 is formed on the portion of the first conductive layer 41 that is exposed. For example, a stacked film of Ti/Pt/Au is used as the pad electrode 44. The thickness of the pad electrode 44 is, for example, not less than 200 nm and not more than 1500 nm (e.g., 500 nm). A bonding wire is connected to the pad electrode 44.

The support substrate 54 is cut away to a thickness of about 100 μm by polishing, etc.; and the back surface electrode 70 is formed on the surface that was cut away. The back surface electrode 70 includes, for example, a stacked film of Ti/Pt/Au. The thickness of the back surface electrode 70 is, for example, not less than 200 nm and not more than 1500 nm (e.g., 500 nm). The back surface electrode 70 is connected to, for example, a heat sink and/or a package.

If necessary, the support substrate 54 is cut by a diamond blade, etc. Thereby, the semiconductor light emitting device 110 is completed.

In the manufacturing method recited above, a sapphire substrate is used as the growth substrate. Si may be used as the growth substrate. In the case where a Si substrate is used as the growth substrate, the growth substrate may be removed by, for example, polishing the growth substrate to be thin and by subsequently removing the remaining growth substrate (the Si substrate) by etching.

Second Embodiment

Figure 9:
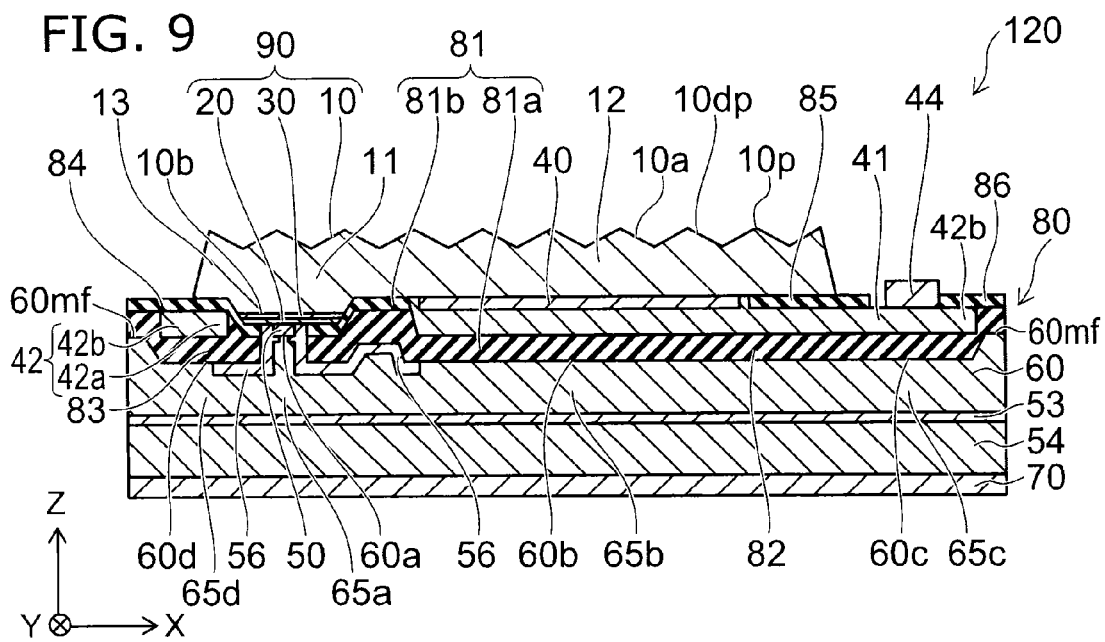
FIG. 9 is a schematic cross-sectional view showing a semiconductor light emitting device according to a second embodiment.

FIG. 9 is a schematic cross-sectional view showing a semiconductor light emitting device according to a second embodiment.

As shown in FIG. 9, the semiconductor light emitting device 120 according to the embodiment includes the metal layer 60, the stacked structural body 90, the first electrode 40, the pad electrode 44, the first conductive layer 41, the second conductive layer 42, the second electrode 50, and the insulating layer 80. The semiconductor light emitting device 120 further includes a reflective layer 56. Otherwise, the semiconductor light emitting device 120 is similar to the semiconductor light emitting device 110, and a description is therefore omitted.

The reflective layer 56 is provided between the insulating layer 80 and the metal layer 60 to overlap a region between the first conductive layer 41 and the second electrode 50 and a region between the second conductive layer 42 and the second electrode 50 when projected onto the X-Y plane. The optical reflectance of the reflective layer 56 is higher than the optical reflectance of the metal layer 60. The light traveling from the stacked structural body 90 toward the metal layer 60 is reflected by the reflective layer 56 at the region between the first conductive layer 41 and the second electrode 50 or at the region between the second conductive layer 42 and the second electrode 50. Thereby, the light extraction efficiency can be increased further. In particular, the amount of the emitted light that is incident on the insulating layer 80 from the vicinity of the side surface of the light emitting layer 30 (the first side surface s1 to the sixth side surface s6) is too large to ignore. By providing the reflective layer 56, the light output is increased by, for example, about 5%.

The reflective layer 56 includes, for example, at least one selected from Ag and Al. The reflective layer 56 has a high reflectance for the light emitted from the light emitting layer 30.

For example, the entire stacked structural body 90 can have a reflective structure by using a reflective metal such as Ag, Al, etc., as the first electrode 40, the second electrode 50, the first conductive layer 41, and the second conductive layer 42 and by further using the reflective layer 56 recited above. Thereby, the light extraction efficiency can be increased further.

The reflective layer 56 may be formed separately from the second electrode 50 or the metal layer 60. The reflective layer 56 may be formed together with the second electrode 50 or the metal layer 60. In the case where the reflective layer 56 is formed in a process that is separate from the second electrode 50, for example, conditions (electrode structure, sintering conditions, etc.) that are appropriate for the processes are applicable. In the case where the reflective layer 56 and the second electrode 50 are formed simultaneously, for example, the number of processes can be reduced; and the cost can be reduced.

According to the embodiments, a semiconductor light emitting device having a high electrostatic discharge immunity is provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In this specification, "perpendicular" and "parallel" are not always exactly perpendicular and parallel and include, for example, variation in the manufacturing process.

Hereinabove, embodiments of the invention are described with reference to specific examples. However, the embodiments of the invention are not limited to these specific examples. For example, one skilled in the art may similarly practice the invention by appropriately selecting specific configurations of components included in the semiconductor light emitting device such as the semiconductor layer, the light emitting layer, the barrier layer, the spacer layer, the well layer, the electrode, the conductive layer, the pad electrode, the bonding layer, the support substrate, the reflective layer, the metal layer, the back surface electrode, the insulating layer, the stacked structural body, etc., from known art; and such practice is within the scope of the invention to the extent that similar effects are obtained.

Components in two or more of the specific examples can be combined with each other as long as technically feasible, and such combinations are also encompassed within the scope of the invention as long as they fall within the spirit of the invention.

The light emitting device described above as the embodiments of the invention can be suitably modified and practiced by those skilled in the art, and such modifications are also encompassed within the scope of the invention as long as they fall within the spirit of the invention.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

What is claimed is:
1. A semiconductor light emitting device, comprising:
a metal layer including a major surface having an inner region and an outer region, the inner region having a first region and a second region, the outer region being provided outside the inner region and having a third region and a fourth region, the first region and the second region being disposed between the third region and the fourth region;

a stacked structural body provided on the major surface of the metal layer, the stacked structural body including
 a first semiconductor layer of a first conductivity type including a first portion provided on the first region, a second portion provided on the second region, and a third portion provided on the fourth region,
 a second semiconductor layer of a second conductivity type provided between the first region and the first portion, the second semiconductor layer not overlapping the third portion, and
 a light emitting layer provided between the first portion and the second semiconductor layer;

a first electrode provided between the second region and the second portion to be electrically connected to the second portion;

a pad electrode provided on the third region;

a first conductive layer provided between the second region and the first electrode and between the third region and the pad electrode, the first conductive layer being configured to electrically connect the first electrode to the pad electrode;

a second conductive layer provided on the fourth region to be electrically connected to the first conductive layer,
the second conductive layer includes:
 a superimposed portion overlapping the third portion in a first direction from the first semiconductor layer toward the second semiconductor layer; and
 a non-superimposed portion not overlapping the first semiconductor layer in the first direction;

a second electrode provided between the first region and the second semiconductor layer to be electrically connected to the second semiconductor layer and the metal layer; and an insulating layer including
 a first insulating portion provided between the second region and the first conductive layer,
 a second insulating portion provided between the third region and the first conductive layer,
 a third insulating portion provided between the fourth region and the second conductive layer, and
 a fourth insulating portion, the second conductive layer being disposed between the fourth insulating portion and the fourth region, a part of the fourth insulating portion being disposed between the superimposed portion and the third portion,
the second conductive layer being disposed between a part of the third insulating portion and the second electrode in a second direction perpendicular to the first direction.

2. The device according to claim 1, wherein
the first insulating portion includes a first side surface portion provided along a first side surface of the first portion of the first semiconductor layer, along a second side surface of the second semiconductor layer, and along a third side surface of the light emitting layer, and
the first side surface portion electrically insulates the first side surface from the metal layer, the second side surface from the metal layer, and the third side surface from the metal layer.

3. The device according to claim 1, wherein the superimposed portion is disposed between the non-superimposed portion and the first region in the second direction.

4. The device according to claim 1, wherein the superimposed portion is disposed between the non-superimposed portion and the light emitting layer in the second direction.

5. The device according to claim 1, wherein
the fourth insulating portion includes a side surface portion provided along a side surface of the first portion of the first semiconductor layer, along a side surface of the second semiconductor layer, and along a side surface of the light emitting layer, and
the side surface portion of the fourth insulating portion electrically insulates the side surface of the first portion of the first semiconductor layer from the metal layer, the side surface of the second semiconductor layer from the metal layer, and the side surface of the light emitting layer from the metal layer.

6. The device according to claim 1, wherein a surface area of the second conductive layer when projected onto a plane perpendicular to the first direction is not less than twice a surface area of a portion where the first conductive layer overlaps the first electrode when projected onto the plane.

7. The device according to claim 1, wherein a thickness of the first conductive layer is thicker than a thickness of the first electrode.

8. The device according to claim 1, wherein a resistivity of the first conductive layer is lower than a resistivity of the first electrode.

9. The device according to claim 1, wherein
the insulating layer further includes a fifth insulating portion provided between the first conductive layer and the second portion, and
at least a portion of the fifth insulating portion is disposed between the first electrode and the pad electrode when projected onto a plane perpendicular to the first direction.

10. The device according to claim 1, wherein a surface area of the second electrode is greater than a surface area of the first electrode.

11. The device according to claim 1, wherein a length of the pad electrode in a direction orthogonal to an extension direction of the first electrode is longer than a length of the first electrode in the orthogonal direction.

12. The device according to claim 1, wherein a portion of the first electrode opposing the second portion includes at least one selected from Ag, Al, Au, and Rh.

13. The device according to claim 1, wherein a portion of the second conductive layer opposing the first semiconductor layer includes at least one selected from Ag, Al, Au, and Rh.

14. The device according to claim 1, further comprising a reflective layer provided between the insulating layer and the metal layer to overlap a region between the first conductive layer and the second electrode and a region between the second conductive layer and the second electrode in the first direction.

15. The device according to claim 1, further comprising a support substrate,
the metal layer being disposed between the stacked structural body and the support substrate,
at least a portion of the support substrate being conductive.

16. The device according to claim 1, wherein
the second conductive layer is in contact with the third insulating portion and the fourth insulating portion.

* * * * *